United States Patent
Trock et al.

(10) Patent No.: US 10,955,472 B1
(45) Date of Patent: Mar. 23, 2021

(54) YIELD-ORIENTED DESIGN-FOR-TEST IN POWER-SWITCHABLE CORES

(71) Applicant: Amazon Technologies, Inc., Seattle, WA (US)

(72) Inventors: Dan Trock, Katzrin (IL); Valentin Bader, Tel Aviv (IL); Shlomi Vilozny, Zoran (IL); Shimon Rahamim, Oranit (IL); Danny Sapoznikov, Misgav Dov (IL); Yair Armoza, Beit Dagan (IL); Itai Avron, Petah Tikva (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/444,917

(22) Filed: Jun. 18, 2019

(51) Int. Cl.
  *G01R 31/3177* (2006.01)
  *G01R 31/317* (2006.01)
(52) U.S. Cl.
  CPC ... *G01R 31/3177* (2013.01); *G01R 31/31704* (2013.01); *G01R 31/31721* (2013.01)
(58) Field of Classification Search
  CPC .................................................. G01R 31/3177
  USPC ........................................ 714/727, 729, 730
  See application file for complete search history.

(56) References Cited

U.S. PATENT DOCUMENTS

| | | | |
|---|---|---|---|
| 2007/0061366 A1* | 3/2007 | Oden | G06Q 30/02 |
| 2012/0030532 A1* | 2/2012 | Jain | G01R 31/318547 |
| | | | 714/726 |
| 2013/0104251 A1* | 4/2013 | Moore | G06F 21/602 |
| | | | 726/30 |
| 2016/0239060 A1* | 8/2016 | Koob | G06F 1/26 |
| 2019/0206565 A1* | 7/2019 | Shelton, IV | A61B 34/74 |

* cited by examiner

*Primary Examiner* — Fritz Alphonse
(74) *Attorney, Agent, or Firm* — Weaver Austin Villeneuve & Sampson LLP

(57) ABSTRACT

An integrated circuit includes first and second cores. Each core has a power-switchable portion in a first power domain in which an operating power is turned on or off in response to a power control signal. The first power domain includes a first scan chain, and the first power domain also includes a plurality of outputs. Each core also includes an always-on portion in a second power domain in which the operating power is maintained during testing of the integrated circuit. The second power domain also has a second scan chain. The second power domain further includes respective isolation gates coupled to the plurality of outputs of the first power domain, and the second scan chain includes a respective wrapper cell coupled to some isolation gates. The integrated circuit is configured to power off and isolate the power-switchable portion in the first power domain based on a scan test result.

20 Claims, 14 Drawing Sheets

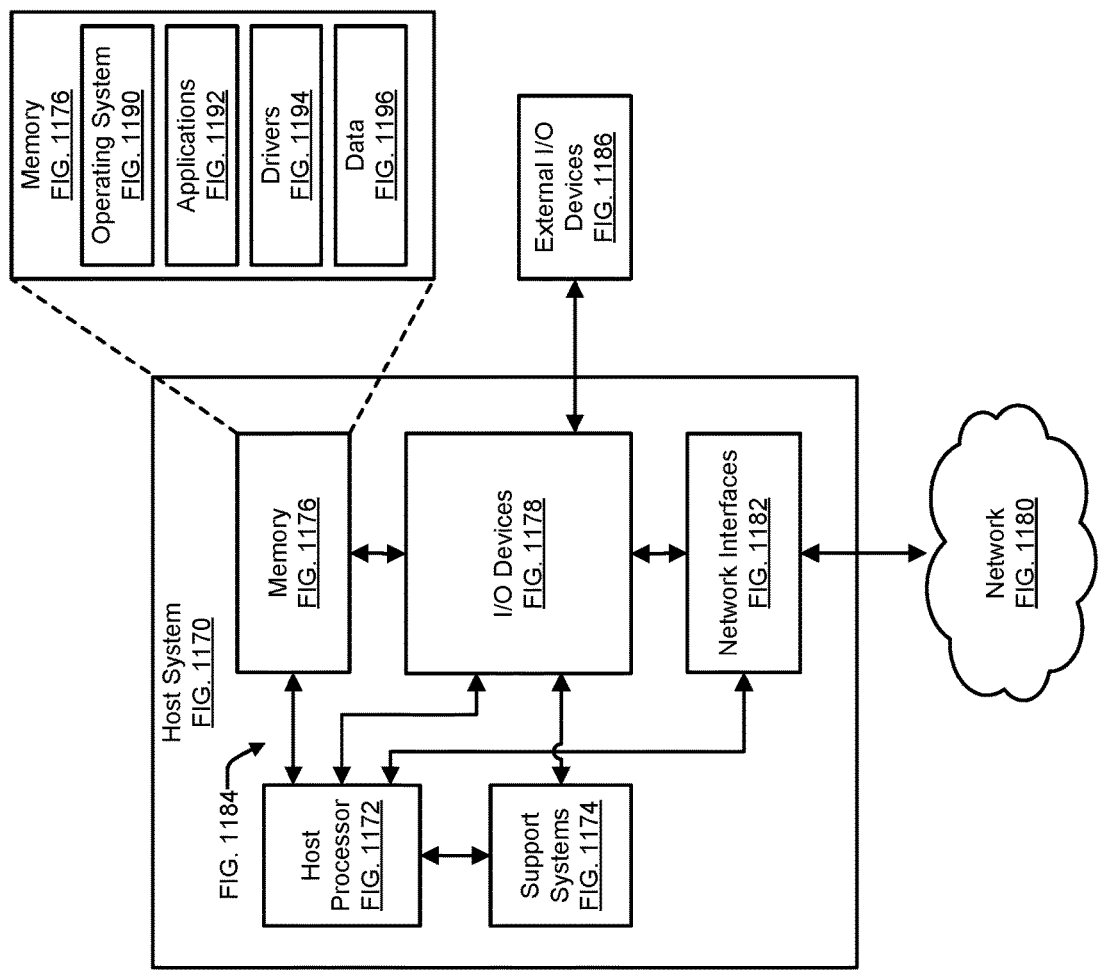

US 10,955,472 B1

YIELD-ORIENTED DESIGN-FOR-TEST IN POWER-SWITCHABLE CORES

BACKGROUND

Many modern integrated circuits include multiple processor cores (also referred to as cores). In design for testability (DFT) applications, integrated circuits are often designed with scan test circuitry that is used during chip manufacturing to test for various internal fault conditions. Scan test circuitry typically comprises scan chains that include multiple scan cells (registers), which are used to gain access to internal nodes of the integrated circuit. The scan cells may be implemented using a series of flip-flops or latches. The scan cells of a given scan chain are configurable to form a serial shift register for shifting in test patterns at inputs to combinational logic of the integrated circuit. The scan cells of the given scan chain are also used to capture outputs from other combinational logic of the integrated circuit. In a scan test mode of operation of the integrated circuit, the scan testing can include a scan shift phase in which the scan cells of a scan chain are configured as a serial shift register for shifting in and out of respective input and output scan data. Scan testing can also include a scan capture phase, in which the scan cells of the scan chain capture scan data from combinational logic. The captured data is subsequently shifted out to compare to expected patterns.

BRIEF DESCRIPTION OF THE DRAWINGS

Various embodiments in accordance with the present disclosure will be described with reference to the drawings, in which:

FIG. 11 illustrates an example architecture for features and systems described herein that includes one or more service provider computers and/or a user device connected via one or more networks, according to certain aspects of the disclosure.

DETAILED DESCRIPTION

Figure 1A:
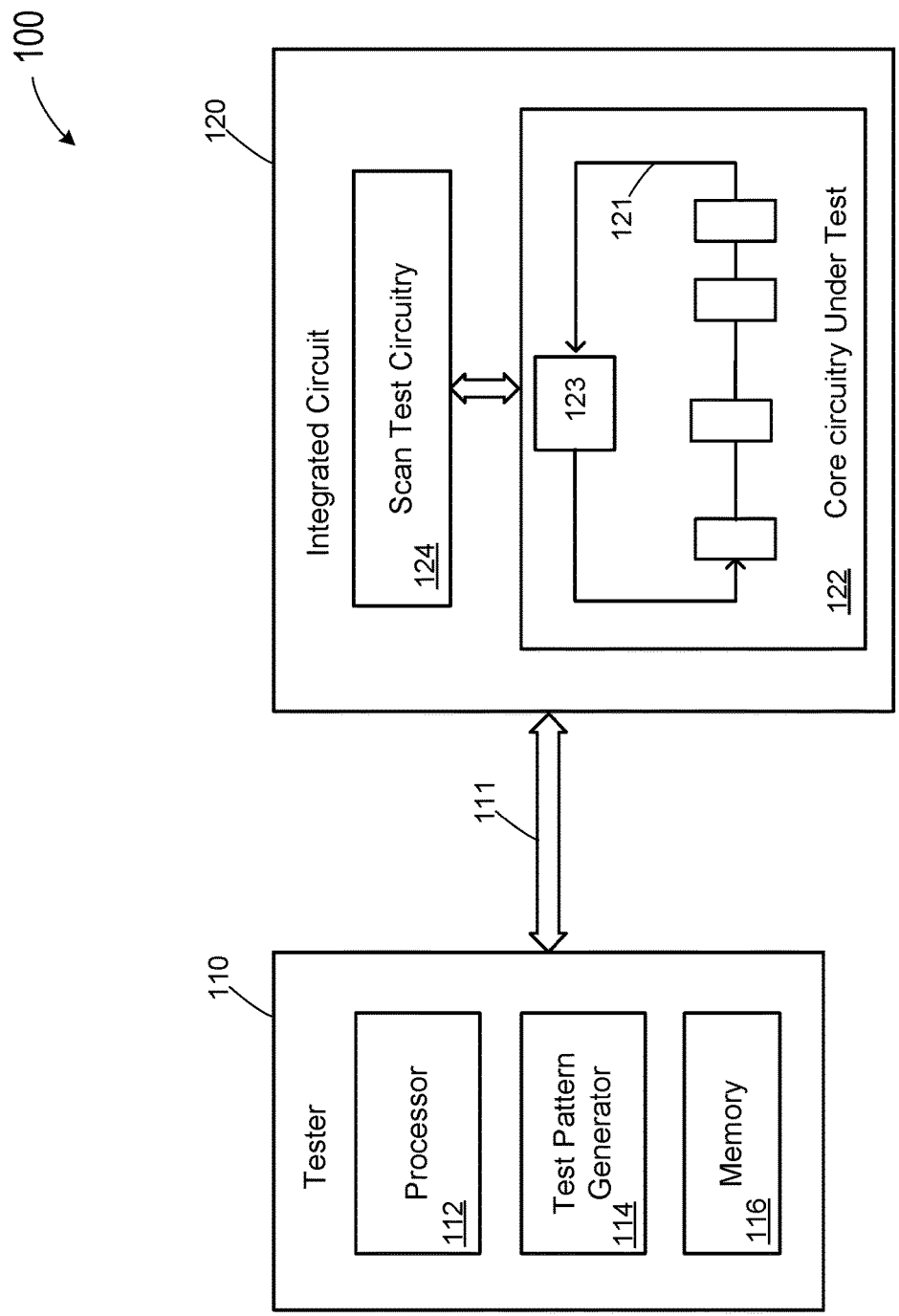
FIG. 1A is a block diagram illustrating an integrated circuit testing system, according to certain aspects of the disclosure.

In semiconductor manufacturing, an integrated circuit chip is often discarded when a defect is detected. However, as the area of the integrated circuit chip continues to increase, it becomes more difficult to maintain a high yield. Many modern integrated circuits include multiple design cores, also referred to as cores. Designating a whole integrated circuit as defective because of a single defective core can substantially reduce the yield of the integrated circuit. In many cases these integrated circuits can operate even when one or more of their cores are inoperable, although a non-operable core may decrease the performance of the integrated circuit. Alternatively, the chip may be designed with one or a few extra cores for redundancy with insignificant area penalty. These extra cores can be used in absorbing random defects and improving manufacturing yield.

According to certain aspects of the disclosure, a method is provided to identify and isolate defective logic areas in a way that would still allow the rest of the chip to continue to function, thereby increasing the production yield. For example, a power isolation infrastructure can be leveraged for isolating manufacturing defects. In a power isolation infrastructure, an integrated circuit device may contain power domains (or islands) that can be disconnected from power supplies by on-chip power switches. In such a state, all outputs from the power switchable domain are intercepted by isolation gates, and the isolation gates are clamped at pre-determined "safe" values. For example, if it is a request signal of a bus, then the safe value during isolation would be "0" to indicate there is no request. In a manufacturing test, a defect inside a power island can be neutralized by putting that island into a power-down (power off) state and turning on the isolation mechanism. Information about defective islands can be stored in an on-chip non-volatile memory and honored every time the device is booted.

In some examples, each design core can be divided into different power domains. As an example, an always-on power domain and one or more power-switchable domains can be provided. The power-switchable domains of the core can be designated as "PD," and the surrounding always-on domain in the core can be designated as "AON." A separate test infrastructure is implemented for PD domains and for the AON domain in the core. This can include partitioning of the memory test engines and the scan chains as well as the scan test vector compression engines. In addition, a logical isolation wrapper for a hierarchical core-based scan test is implemented and is built in a way that it is fully contained within the AON domain. In this structure, PD external interface signals can be intercepted with dedicated wrapper cells. In this arrangement, observation points of any defect within the PD domain cannot leak to outside of the core, and are captured either by a scan chain flop in the PD or AON domain, or by the wrapper chain flop in the AON domain of the core. In this design, a defective core can be unambiguously identified from the failing ATE test channels in production real time. Without such wrapper, a failure in one core (either PD or AON domain) could propagate to another core and be observed there via the output channels of that core, but the straightforward logical connection between the failure and the core that contains the defect would have been lost in this case. Maintaining straightforward logical connection is useful in isolation of faulty domains in production in real time, when there is a high-volume stream of devices to be tested and sorted, and the test costs are high and charged by the seconds by the foundry.

According to certain aspects of the disclosure, an integrated circuit includes a plurality of cores. Each core can include a power-switchable portion in a first power domain and an always-on portion in a second power domain. In the first power domain, the operating power can be turned on or off. The first power domain can also have a first scan chain for performing scan testing in the first power domain. The second power domain, stays powered on during testing of the integrated circuit. The second power domain also has a second scan chain and a second compression engine for performing scan testing in the second power domain. The core further includes an isolation gate coupled to each output of the first power domain. The second scan chain in the second power domain also includes a wrapper cell coupled to each of the isolation gates that drives an external interface of the core. The integrated circuit is configured to deactivate and isolate the power-switchable portion of a core, if the core fails a first internal mode scan test but passes a second internal mode scan test and an external mode scan test. The first internal mode scan test is performed on the power-switchable portion and the always-on portion of the core using the first scan chain and the second scan chain with both the first power domain and the second power domain powered on. The second internal mode scan test is performed on the always-on portion using the second scan chain with the power-switchable portion powered off and isolated. The external mode scan test is performed on interfaces between cores.

According to certain aspects of the disclosure, an integrated circuit has first and second cores. Each core has a power-switchable portion in a first power domain in which an operating power is turned on or off in response to a power control signal. The first power domain includes a first scan chain for performing scan testing in the first power domain, and the first power domain also includes a plurality of outputs. A subset of the plurality of outputs, e.g., first and second outputs, drive external interface of the core. Each core also includes an always-on portion in a second power domain in which the operating power is maintained during testing of the integrated circuit. The second power domain also has a second scan chain for performing scan testing in the second power domain. The second power domain further includes respective isolation gates coupled to the plurality of outputs of the first power domain, and the second scan chain includes a respective wrapper cell coupled to isolation gates that are coupled to the first and second outputs that drive external interface of the core. The integrated circuit is configured to power-down and isolate the power-switchable portion in the first power domain based on a scan test result.

According to certain aspects of the disclosure, in the above integrated circuit, in the second power domain, the second scan chain includes a wrapper cell coupled to some of the isolation gates. The second scan chain can have one or more wrapper cells that are functional registers in the integrated circuit, and the second scan chain can also have one or more dedicated wrapper cells that are not functional registers in the integrated circuit. These one or more dedicated wrapper cells are coupled to external interface signals that extend from the power-switchable portion to outside the core.

According to certain aspects of the disclosure, a method for testing an integrated circuit includes selecting a core in the integrated circuit for testing. The integrated circuit can have first and second cores. Each of the first and second cores includes a power-switchable portion in a first power domain and an always-on portion in a second power domain. The first power domain has a first scan chain, and the second power domain has a second scan chain. The method includes performing a first internal mode scan test of both the power-switchable portion and always-on portion and isolation gates of the selected core using the first scan chain and the second scan chain with both the first power domain and the second power domain powered on.

The method also includes performing a second internal mode scan test in the always-on portion using the second scan chain with the power-switchable portion powered off and isolated. The method further includes determining, based on the first internal mode scan test or the second internal mode scan test, information about whether the power-switchable portion of the selected core should be powered off and isolated during operation of the integrated circuit.

According to certain aspects of the disclosure, the above method can also include determining if the selected core fails the second internal mode scan test and, if so, determining that the integrated circuit is to be discarded. The method also includes performing an external mode scan test of interfaces between the first and second cores, with power-switchable portions in all cores powered off. If the core fails the external mode scan test, the method determines that the integrated circuit is to be discarded. Moreover, if the core fails the first internal mode scan test, and passes the second internal mode scan test and the external mode scan test, the power-switchable portion of the core is to be deactivated and isolated.

Various examples will be described. For purposes of explanation, specific configurations and details are set forth in order to provide a thorough understanding of the examples. However, it will also be apparent to one skilled in the art that the examples may be practiced without the specific details. Furthermore, well-known features may be omitted or simplified in order not to obscure the embodiments being described.

FIG. 1A is a block diagram illustrating an integrated circuit testing system, according to certain aspects of the disclosure. FIG. 1A shows an integrated circuit testing system 100 including a tester 110 and an integrated circuit 120 that is coupled to the tester 110 through an interface 111. The tester 110 can be an automated test equipment (ATE) that can include a processor 112, a test pattern generator 114, and a memory 116, etc. The processor 112 can use the test pattern generator 114 to perform various forms of scan testing and functional mode testing of the integrated circuit. The test pattern generator 114 can include software modules that are executed within the processor 120. Alternatively, the test pattern generator 114 can be implemented using dedicated logic circuits and firmware.

As further shown in FIG. 1A, the integrated circuit 120 can include a core circuitry 122 and a scan test circuitry 124, among other components and blocks. The scan test circuitry 124 is coupled to the internal core circuitry 122 for scan testing the internal core circuitry (e.g., processors, memory blocks, other combinatorial logic circuits, etc.) using the scan test circuitry. In an embodiment, the core circuitry 122 can have one or more scan chains 121 including multiple scan cells 123. The scan test circuitry 124 can implement a scan test protocol and other test modes of operation (e.g., standard scan testing, built-in-self-test (BIST) testing, and functional mode testing operations, etc.) using test patterns generated by the test pattern generator 114 of the tester 110. The scan test data generated by the scan test circuitry 124 can be accessed by the tester 110 through the interface 111.

Figure 1B:
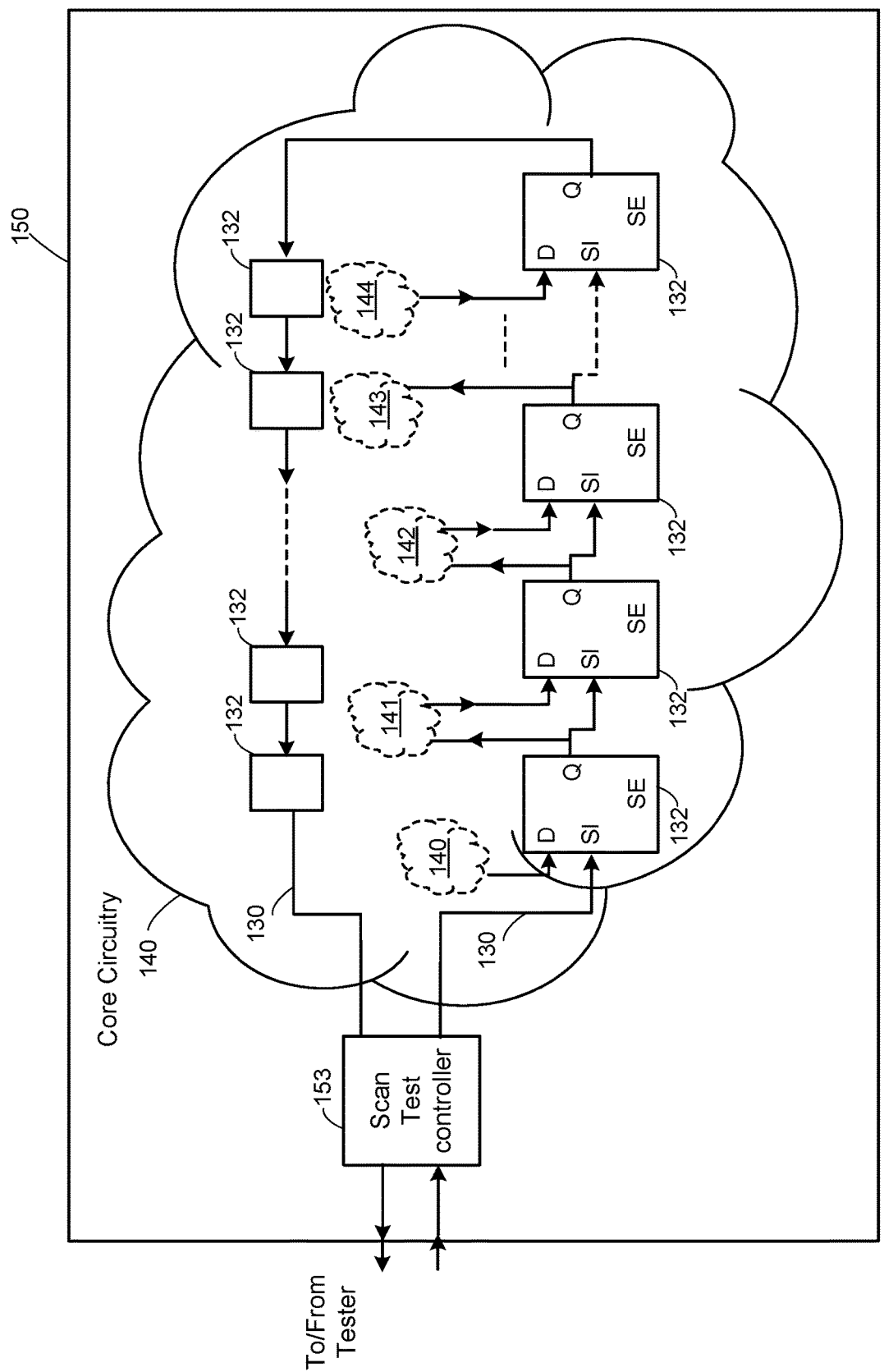
FIG. 1B is a block diagram illustrating a circuit cell with a scan test, according to certain aspects of the disclosure.

FIG. 1B is a block diagram showing a portion of an integrated circuit 150 including a scan chain, according to certain aspects of the disclosure. A scan chain 130 includes a plurality of scan cells 132 that are coupled with various circuit blocks of a core circuitry 140 that is under test. Each scan cell 132 can be a scan flip-flop (SFF) with a data (D) input port, a scan input (SI) port, a data (Q) output port, and scan enable (SE) control port. Each scan cell 132 also has a clock (CLK) input port, which is not shown to simplify the drawing. Integrated circuit 150 can have a number of scan chains, and the number of scan cells in each scan chain can vary depending on the type of integrated circuit to be tested and the target test applications.

Core circuitry 140 represents functional blocks in the core design part, and can include scan cells 132. In the example of FIG. 1B, the circuit blocks 141, 142, 143, and 144 in core circuitry 140 are arranged between the Q output port of one scan cell 132 and the D input port of an adjacent downstream scan cell 132 in the scan chain 130. Moreover, the Q output port of one scan cell 132 is connected to the SI port of an adjacent downstream scan cell 132 in the scan chain 130. The first scan input (SI) port of the first scan cell 132 in the scan chains 130 is connected to the scan test controller 153 to receive scan-in data. The Q output port of the last scan cell 132 in the scan chain 130 is connected to the scan test controller 153 to provide scan-out data. The circuit blocks 141-144, etc., can include other types of functional logic circuitry or combinatorial logic blocks, depending on the architecture and function of the integrated circuit.

The scan enable (SE) signal determines whether the device is in a functional mode or a scan mode. In the functional mode, the D input of the scan cell 132 gets data input from a functional unit. In the scan mode enabled by the SE signal, the SI input the scan cell 132 gets scan test input. The scan test result data can be shifted out of the scan chain 130 through the scan test controller to the external tester.

Figure 2:
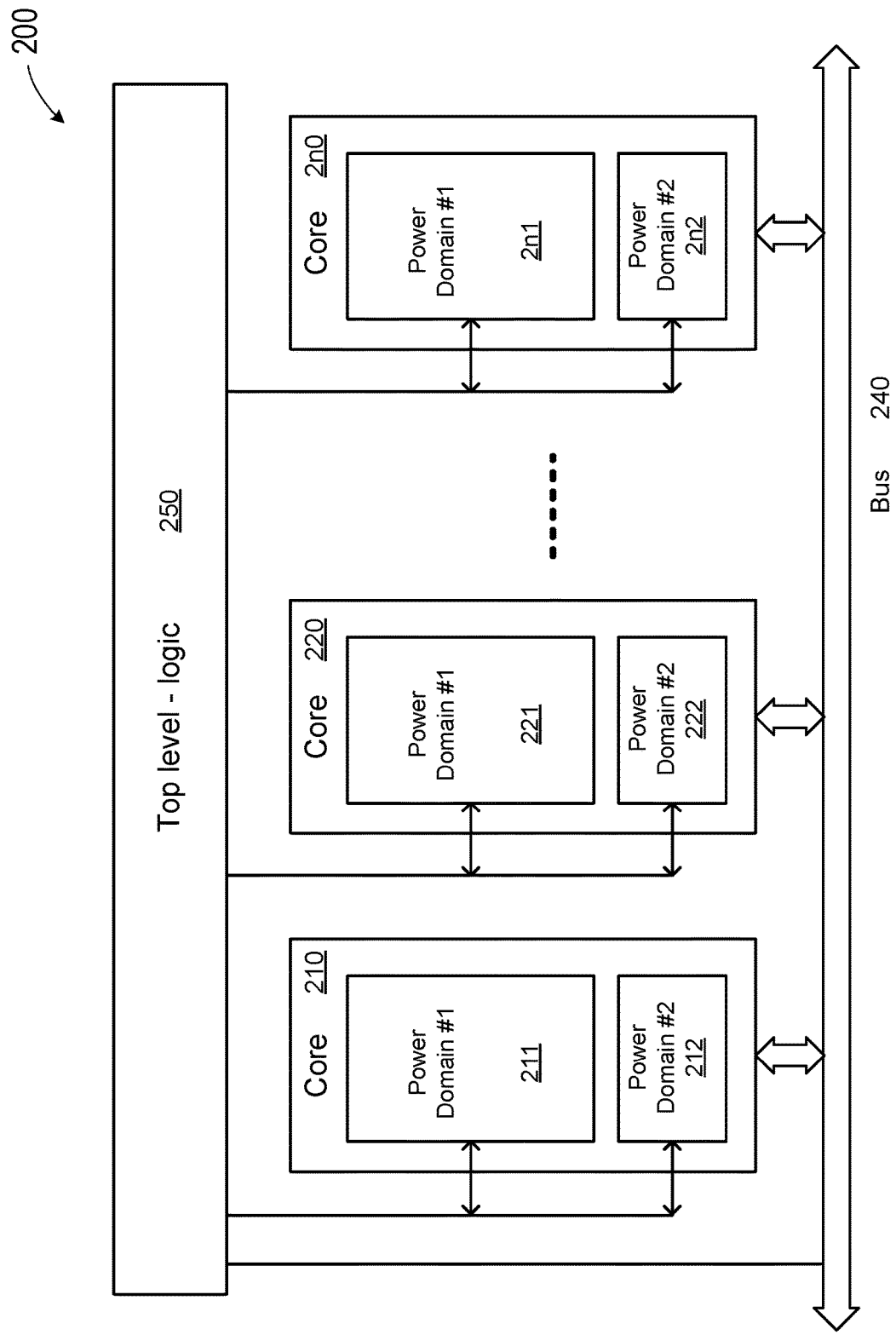
FIG. 2 is a block diagram illustrating an integrated circuit that includes multiple cores, according to certain aspects of the disclosure.

FIG. 2 is a block diagram illustrating an integrated circuit that includes multiple cores, according to certain aspects of the disclosure. FIG. 2 shows an integrated circuit 200 having a plurality of cores 210, 220, . . . , and 2n0, with n being an integer. As used herein, a core, or a design core, refers to a reusable integrated circuit block. For example, a design core can be a physical macro with standalone design and backend implementation processes that can include logic and clock tree synthesis, scan insertion, place and route, timing closure, and more, resulting in a complete GDS-II (Graphic Database System-II) representation needed by the foundry for manufacturing the core. A device or chip may contain hundreds and even thousands of design cores. Examples of a design core can include a microprocessor, central processing unit (CPU), digital signal processor (DSP), application-specific integrated circuit (ASIC), or smaller function circuit blocks, etc. Examples of an integrated circuit having multiple cores can include a multi-core processor, such as a 64-core processor.

Each such design core can be equipped with DFT (design for testability) logic and components, including a compress-decompress engine for scan test vectors. These engines receive a small amount of scan data channels from an automatic test equipment (ATE) external to the device, through the device's I/O pins, decompress the data and drive a high number of short internal scan chains. The response from this stimuli is then compacted and returned to the ATE to detect manufacturing defects based on comparison with a target response simulated on a defect-free device.

In integrated circuit 200 illustrated in FIG. 2, cores 210, 220, . . . , and 2n0, etc. can be instances from the same design core. Alternatively, cores 210, 220, . . . , and 2n0, etc., can represent different circuit blocks. As shown in FIG. 2, cores 210, 220, . . . , and 2n0, etc., are coupled to a bus 240 for data transfer. For example, the bus 240 can handle the functional interface between the cores.

Integrated circuit 200 has a top-level logic block 250, which can include higher-level circuits for coordinating the cores 210, 220, . . . , and 2n0, etc. Top-level logic block 250 can also include glue logic for communication between the cores 210, 220, . . . , and 2n0, etc. In some examples, top-level logic block 250 can also interface with an external tester, e.g., an automatic test equipment (ATE) to perform a scan test of the integrated circuit. For example, in a hierarchical DFT methodology, the scan test can include a scan test in an internal mode or in an external mode. In the internal test mode, the logic within the core is tested. In the external test mode, the top-level logic, interconnects, and interfaces between cores are tested. Depending on the implementation, the top-level logic block 250 can include circuitry for management and coordination of the multiple cores. For example, the top-level logic block 250 can have processors, and memories, including non-volatile memories, etc.

As shown in FIG. 2, each core 210, 220, . . . , and 2n0, etc., is divided into two power domains. For example, core 210 includes a power-switchable portion in a first power domain 211, and an always-on portion in a second power domain 212. In a first power domain 211, the operating power can be turned on or off in response to a power control signal. The first power domain 211 includes a first scan chain for performing scan testing in the first power domain. In the always-on power domain 212, the operating power is maintained during operation of the integrated circuit, and the second power domain includes a second scan chain for performing scan testing in the second power domain. Similarly, core 220 includes a power-switchable portion 221 in a first power domain, and an always-on portion in a second power domain 222. Moreover, core 2n0 includes a power-switchable portion 2n1 in a first power domain, and an always-on portion in a second power domain 2n2. An example of a core is described below in detail in connection to FIG. 3A. To simplify the description here, each core is shown to have two power domains. However, it is understood that each core can have more than two power domains, and each core can have an additional power-switchable portion in an additional power domain. For example, an always-on power domain and one or more power-switchable domains. In another example, a core can have one or more power domains inside a power domain, where both are switchable. For example, in a cluster having several cores, and single core or the entire cluster can be switched on or off. Further, the always-on power domain refers to the portion of the system that stays powered on when the system is powered on or when the system is under test. In contrast, the power-switchable domains can be selectively turned off by the system. As an example, during a test, the always-on domain may contain circuits needed to perform the test, and the power-switchable domains can be powered off depending on the test conditions.

Figure 3A:
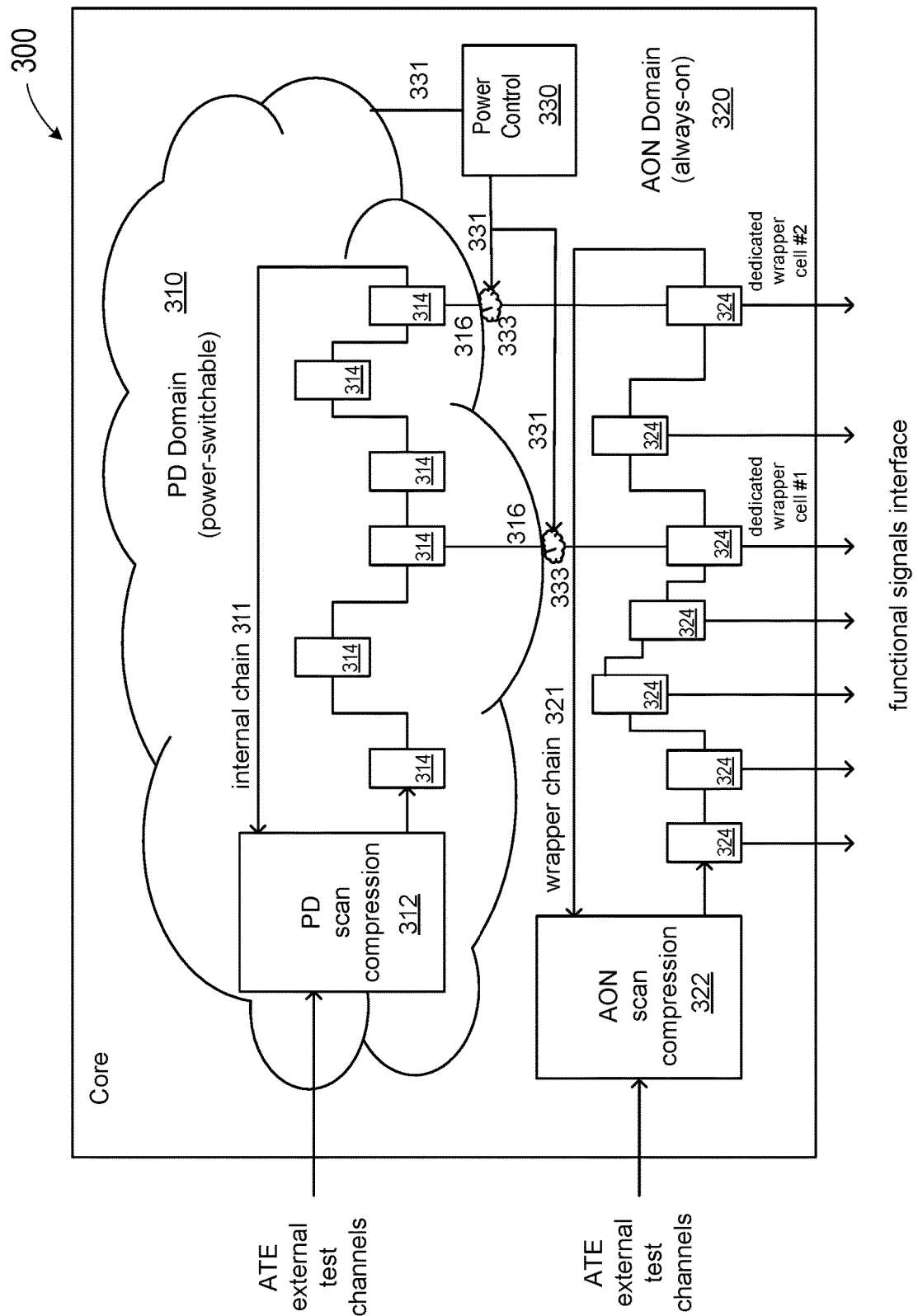
FIG. 3A is a schematic diagram illustrating an exemplary core having two power domains in an integrated circuit, according to certain aspects of the disclosure.

FIG. 3A is a schematic diagram illustrating an example of a core having two power domains in an integrated circuit, according to certain aspects of the disclosure. Core 300 illustrated in FIG. 3A is an example of cores that can be one of the cores in integrated circuit 200 as shown in FIG. 2. As shown in FIG. 3A, core 300 includes a power-switchable portion in a first power domain 310, and an always-on portion in a second power domain 320. As illustrated in FIG. 3A, the power-switchable portion is also labeled as PD domain, and the always-on domain is also labeled as the AON domain. In the example of FIG. 3A, core 300 also includes a power control unit 330, which controls the power switching in the first power domain 310 and power isolation between domains. The functional signal interface for the core illustrated in FIG. 3A can be implemented through the bus 240 or the top-level logic block 250 as shown in FIG. 2. The top-level logic block 250 can have a power management unit that can provide power control signals for turning on or off the power-switchable domains. In a functional mode, selected power domains can be turned off for power saving. As described below, a failed power-switchable domain of a core can be powered off and isolated during the operation of the integrated circuit.

For example, the AON can include power management control, isolation logic, and some more miscellaneous and glue logic, while most of the core logic is in the power-switchable domain. In some examples, a separate test infrastructure is implemented for the power-switchable domains and the always-on domain in the core. This can include partitioning of the memory test engines and the scan chains as well as the scan test vector compression engines. In addition, a logical isolation wrapper for a hierarchical core-based scan test can also be implemented and built in a way that it is fully contained within the always-on domain. In some examples, the first power domain can include most of the core logic circuit, and the second power domain can include the wrapper chain and other circuits. This design can allow isolation of a failed cell.

In the first power domain 310, the operating power can be turned on or off in response to a power control signal 331 from power control unit 330. Besides the core logic circuitry, the first power domain 310 can include a first scan chain 311 for performing scan testing in the first power domain. The first scan chain 311 includes scan cells 314. The first power domain 310 also includes a first test compression engine 312 for coupling between the first scan chain 311 to external test channels of an ATE. In some examples, the first scan chain 311 in FIG. 3A can be similar to scan chain 130 described in FIG. 1B, and scan cells 314 in FIG. 3A can be similar to scan cells 132 described in FIG. 1B. In FIG. 3A, the first test compression engine 312 is shown inside the power-switchable domain 310. Alternatively, the first test compression engine 312 can also reside in the always-on power domain 320. In systems with more than one power-switchable domain, some of the power-switchable domains can share a common test compression engine. In that case, the test compression engine can reside in the always on domain.

The first test compression engine 312 in the first power domain 310 can receive a compressed test vector. The first test compression engine 312 can also include a test input decompressor and a test result compressor (not shown). In design for testability (DFT), scan and automatic test pattern generation (ATPG) use test vectors to test each gate and path in a design or to perform a functional test of the design. As chips increase in size, the ratio of logic to be tested per pin increases dramatically, and the volume of scan test data starts causing a significant increase in test time, and required tester memory. Test compression was developed to reduce the volume of test data and the test time. When an ATPG tool generates a test for a fault, or a set of faults, only a small percentage of scan cells need to take specific values. The rest of the scan chain is in a "don't care" state and can take a random value. Test compression takes advantage of the small number of significant values to reduce test data and test time. Many different decompression methods can be used. One common choice is a linear feedback shift register, where the compressed stimuli are computed by solving linear equations corresponding to internal scan cells with specified positions in partially specified test patterns. In some cases, a circuit under test can have multiple scan chains inside the core with a limited number of top-level scan ports used for loading and unloading these chains.

During operation, the test inputs can receive a compressed test vector, and the test input decompressor can decompress the compressed test vector to generate an uncompressed test vector, and the uncompressed test vector can be scanned into one or more scan chains. After test capture, the response vector can be scanned out of the scan chains. The response vector can be compressed and sent out via test channels to ATE.

In the always-on power domain 320, the operating power is maintained during operation of the integrated circuit. The second power domain 320 includes a second scan chain 321 for performing scan testing in the second power domain and providing wrapper cells for the first power domain 310. The second scan chain 321 includes scan cells 324. In some examples, the second scan chain 321 can be similar to scan chain 130 described in FIG. 1B, and scan cells 324 in FIG. 3A can be similar to scan cells 132 described in FIG. 1B.

The second power domain 320 can also include a second scan test compression engine 322 in the second power domain 320. Similar to scan test compression engine 312 in the first power domain, the second scan test compression engine 322 can receive a compressed test vector. The second test compression engine 322 can also include a test input decompressor and a test result compressor (not shown). During operation, the test inputs can receive a compressed test vector, and the test input decompressor can decompress the compressed test vector to generate an uncompressed test vector, and the uncompressed test vector can be scanned into one or more scan chains. After capture, the response vector can be scanned out of the scan chains. The response vector can be compressed and sent out via test channels to ATE.

To facilitate power isolation and test isolation between the first power domain, the second power domain, and the external domain, the second power domain 320 also includes wrapper cells and isolation gates. As illustrated in FIG. 3A, the second power domain 320 includes an isolation gate 333 coupled to each output 316 of the first power domain 310. Moreover, the second scan chain 321 also includes a wrapper cell 324 coupled to some of the isolation gates 333 associated with an output of the circuitry in the first power domain 310.

The isolation gates 333 are configured to isolate the outputs of the first power domain from the second power domain under the control of the power control unit 330. The isolation gates 333 may have an input connected to an output 316 of the first power domain 310, and another input for receiving control signals from the power control unit 330. The isolation gates 333 may also have an output that is coupled to a wrapper cell 324 in the second power domain 320. The isolation gates 333 may include logic gates and logic circuits to clamp its output at a pre-determined logic state in response to a power control signal 331 from the power control unit 330. For example, the outputs of the first power domain 310 may be powered off and isolated to allow for an internal core test of the second power domain 320. The outputs 316 of the first power domain 310 may be clamped to a preset value to decouple the first power domain 310 from the rest of the integrated circuit.

As noted above, the second power domain 320 includes dedicated wrapper cells 324 that are coupled to one or more isolation gates 333. In the DFT design stage, wrapper cells can be inserted around the input/outputs (I/Os) of a partition of a circuit to isolate it during a test mode. The wrapper cell can be configured to operate in a normal function mode, an internal core test mode, or an external interconnect test mode. As an example, the test wrapper cells 324 may include a latch, or flip-flop, and selection circuits configured to receive either cell functional input or cell test input, and to output either cell functional output or cell test output. For example, the selection circuits can be multiplexers. In some cases, the wrapper cells can be similar to the scan cells described above in connection with FIG. 1B.

In FIG. 3A, two wrapper cells 324 are coupled to the two isolation gates 333, respectively, and the two isolation gates 333 are shown being coupled to two outputs 316, respectively, of the first power domain. The two wrapper cells 324 that are coupled to the isolation gates 333 and the outputs 316 of the first power domain 310 are labeled "dedicated wrapper cell #1" and "dedicated wrapper cell #2." The second scan chain 321 also includes other scan cells 324 for testing the circuitry in the second power domain. These other scan cells 324 can be referred to as shared wrapper cells that are also functional cells used in functional mission mode and used as wrapper cells during test mode. In contrast, the two dedicated wrapper cells, #1 and #2, are configured only for testing, and are not shared wrapper cells. In FIG. 3A, the second scan chain 321 is labeled as a wrapper chain. In FIG. 3A, only two outputs 316 of the first power domain 310 are shown. However, it is understood that the first power domain 310 can have more than two outputs, and some of the outputs may drive external interface of the core.

In core 300, scan testing can be performed with the first power domain 310 and the second domain 320 together. For example, in an internal mode test, the full circuitry in core 300, in both the first power domain 310 and the second power domain 320, is powered on. In the internal test mode, the isolation gates and logic are testable by ATPG. The ATPG tool treats them as random logic and may activate the isolation in one pattern of the test pattern set and deactivate the isolation in another. For example, the isolation gates 333 can be configured to allow the outputs 316 of the first power domain 310 to pass through to the second power domain 320. During the testing of the full core, the test input decompressors in the first and second scan compression engines 312 and 322 can decompress the compressed test vector to generate an uncompressed test vector, and the uncompressed test vector can be scanned into scan chain 311 and 321. After capture, the response vector can be scanned out of both scan chain 311 and 321. The test result compressors in the first scan compression engine 312 and second compression engines 322 can generate a compressed response vector by compressing the response vector, and the response outputs can receive the compressed response vector for sending the test channels to the ATE.

Similarly, during the testing in the second power domain 320 alone, the test input decompressor in the second scan compression engine 322 can decompress the compressed test vector to generate an uncompressed test vector, and the uncompressed test vector can be scanned into scan chain 321 with the isolation gates at clamp values. After capture, the response vector can be scanned out of the scan chain 321. The second power domain 320 can be tested with the first power domain 310 powered off and isolated, as described below in connection with FIG. 3B.

Figure 3B:
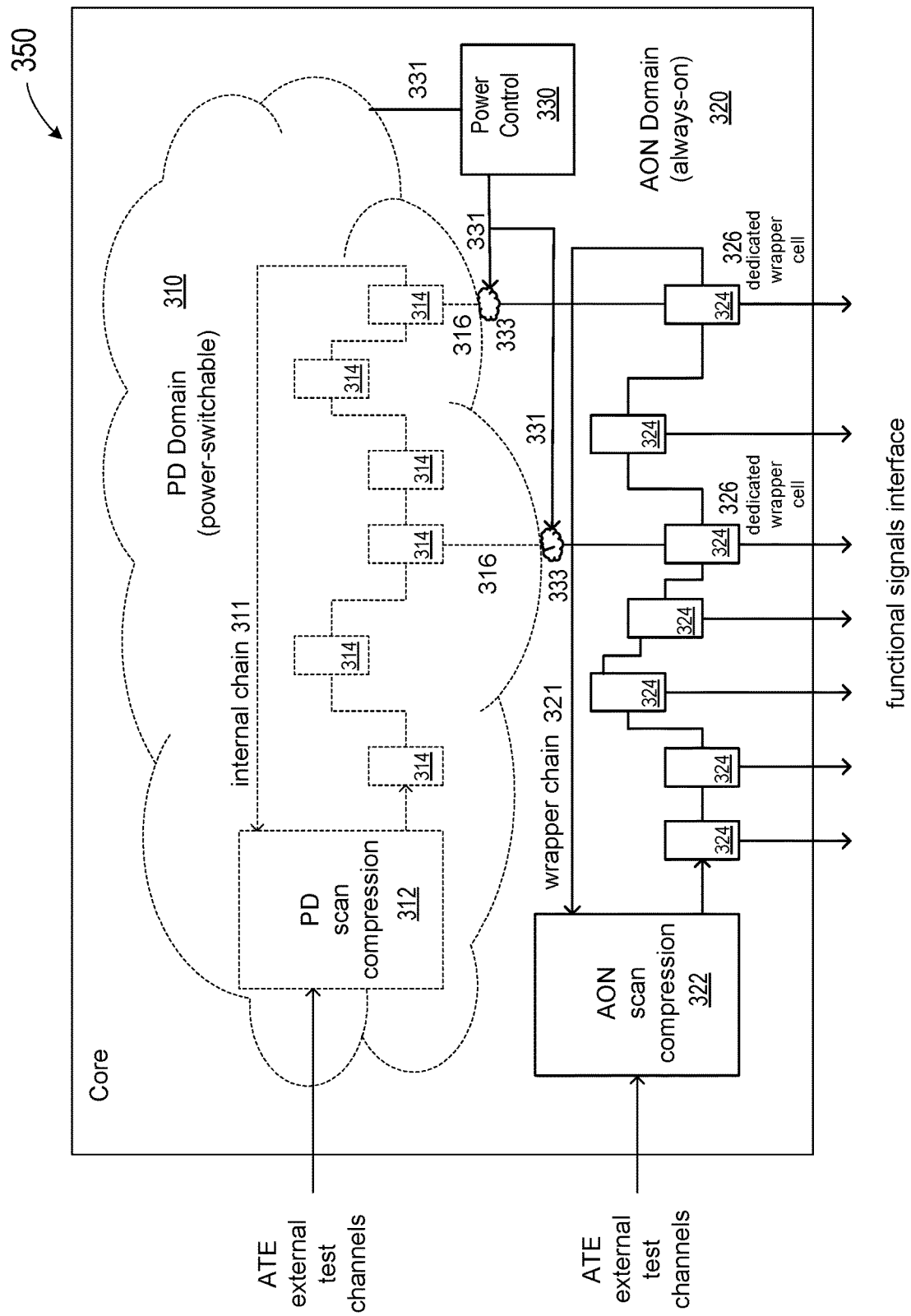
FIG. 3B is a schematic diagram illustrating an exemplary core with a power domain powered off in an integrated circuit, according to certain aspects of the disclosure.

FIG. 3B is a schematic diagram illustrating an exemplary core in an integrated circuit with a power domain powered off and isolated, according to certain aspects of the disclosure. As shown in FIG. 3B, core 350 in FIG. 3B is similar to core 300 in FIG. 3A. However, in core 350 as illustrated in FIG. 3B, the first power domain 310 is powered off and isolated to facilitate a scan test of the second power domain 320 alone. The first power domain 310 is shown in broken lines in FIG. 3B, to indicate that it is powered off. This complementary test procedure allows to conclude whether defect is contained within PD.

The process of the internal core testing of the second power domain 320 in core 300 may start with the power control unit 330 receiving a second power domain DFT internal core test mode control signal. The second power domain DFT internal core test mode control signal may come from a top-level logic in the integrated circuit, for example, similar to the top-level logic 250 in the integrated circuit 200 illustrated in FIG. 2. The power control unit 330 then controls one or more isolation gates to the clamped values of the isolation gates and powers down the first power domain 310 in response to the DFT internal core test mode control signal.

Figure 4A:
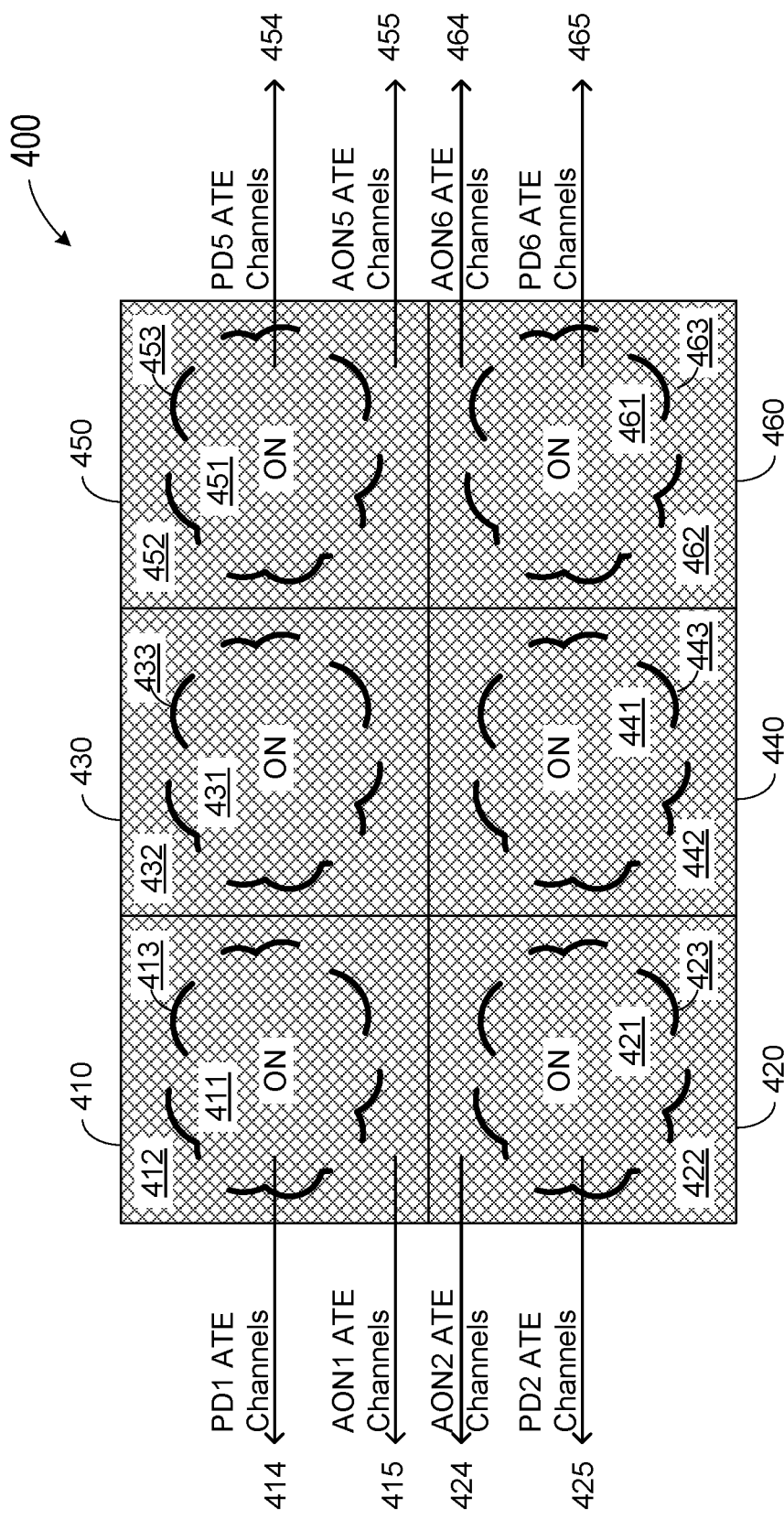
FIG. 4A is a schematic diagram illustrating an integrated circuit with multiple cores having two power domains in an integrated circuit, according to certain aspects of the disclosure.
Figure 4B:
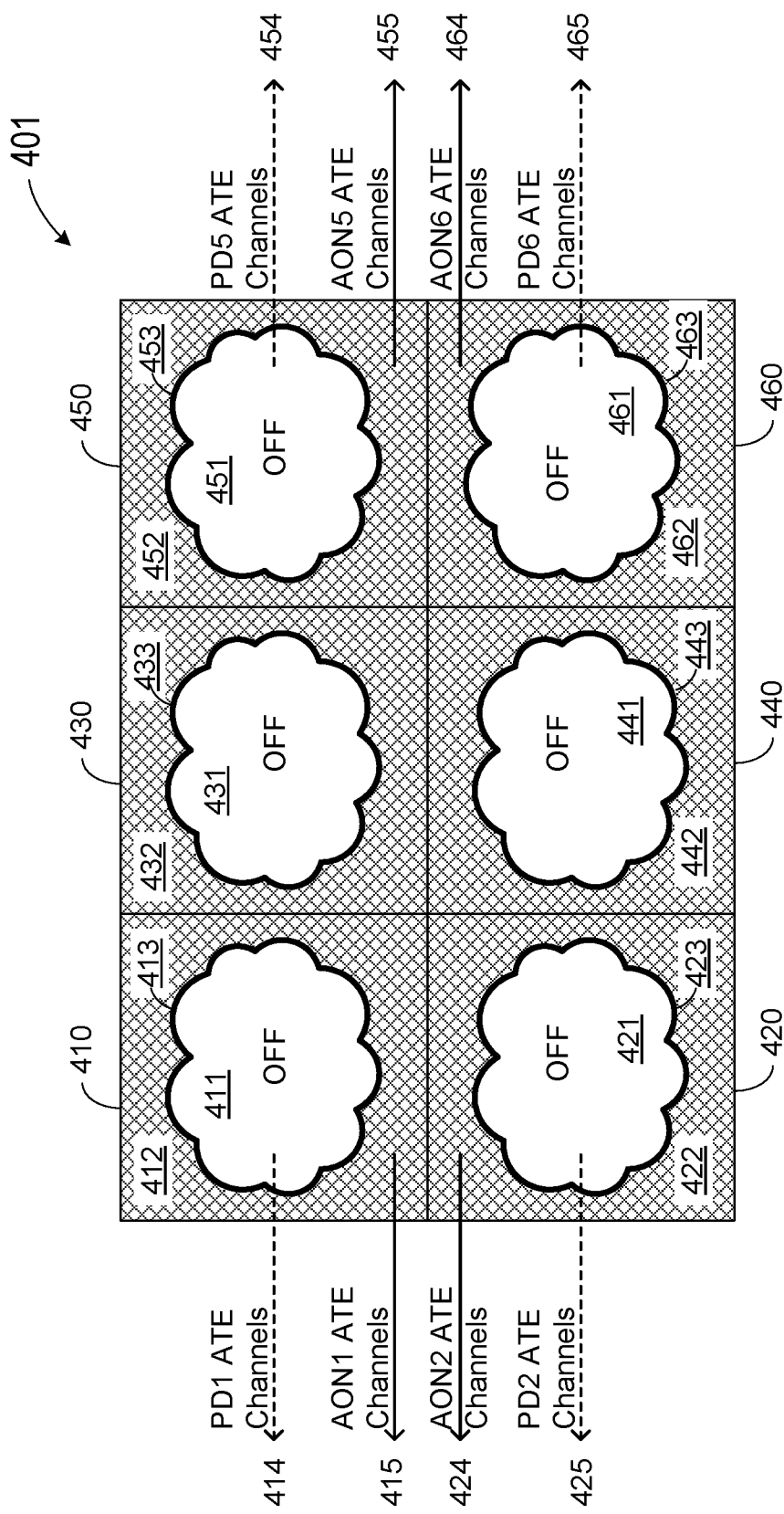
FIG. 4B is a schematic diagram illustrating an integrated circuit with multiple cores with a power domain powered off, according to certain aspects of the disclosure.

FIG. 4A is a schematic diagram illustrating an integrated circuit with multiple cores having two power domains in an integrated circuit, according to certain aspects of the disclosure. FIG. 4B is a schematic diagram illustrating an integrated circuit with multiple cores with a power domain powered off, according to certain aspects of the disclosure. As illustrated in FIGS. 4A and 4B, integrated circuit 400 includes a plurality of cores 410-460, and each core is divided into at least two power domains. For example, core 410 includes a power-switchable domain (PD) 411 and an always-on power domain (AON) 412. Core 410 also has test channels coupled to an ATE, for example, PD1 ATE channels 414 for the power-switchable domain 411 and AON1 ATE channels 415 for the always-on power domain 412. Similarly, core 420 includes a power-switchable domain 421 and an always-on power domain 422, with test channels 424 and 425, respectively. As also shown in FIG. 4A, core 450 includes a power-switchable domain 451 and an always-on power domain 452, with test channels 454 and 455, respectively. Moreover, core 460 includes a power-switchable domain 461 and an always-on power domain 462, with test channels 464 and 465, respectively. In FIG. 4B, test channels 414, 425, 454, and 465 are shown in broken lines to show that they are powered off.

As will be described in more detail below, two internal mode core tests can be carried out. FIG. 4A illustrates a first internal mode core test, in which all power domains are turned on, and FIG. 4B illustrates a second internal mode core test, in which the power-switchable domains are turned off, similar to that illustrated in connection with FIG. 3B. The test results can be observed on the test channels. In the first internal mode test in FIG. 4A, a defect can be associated with a particular core. For example, if errors are observed on test channels 414 or 415, then it can be determined that the defect exists in core 410. In the second internal mode test in FIG. 4B, if no defect is observed in the AON domain on channel 415 for the first core 410, then it can be determined that the defect is in the power-switchable domain 412, which can be isolated and powered off. During these tests, the dedicated wrapper cells described above in connection with FIGS. 3A and 3B are used to prevent the defects from propagating to other cells.

Figure 5:
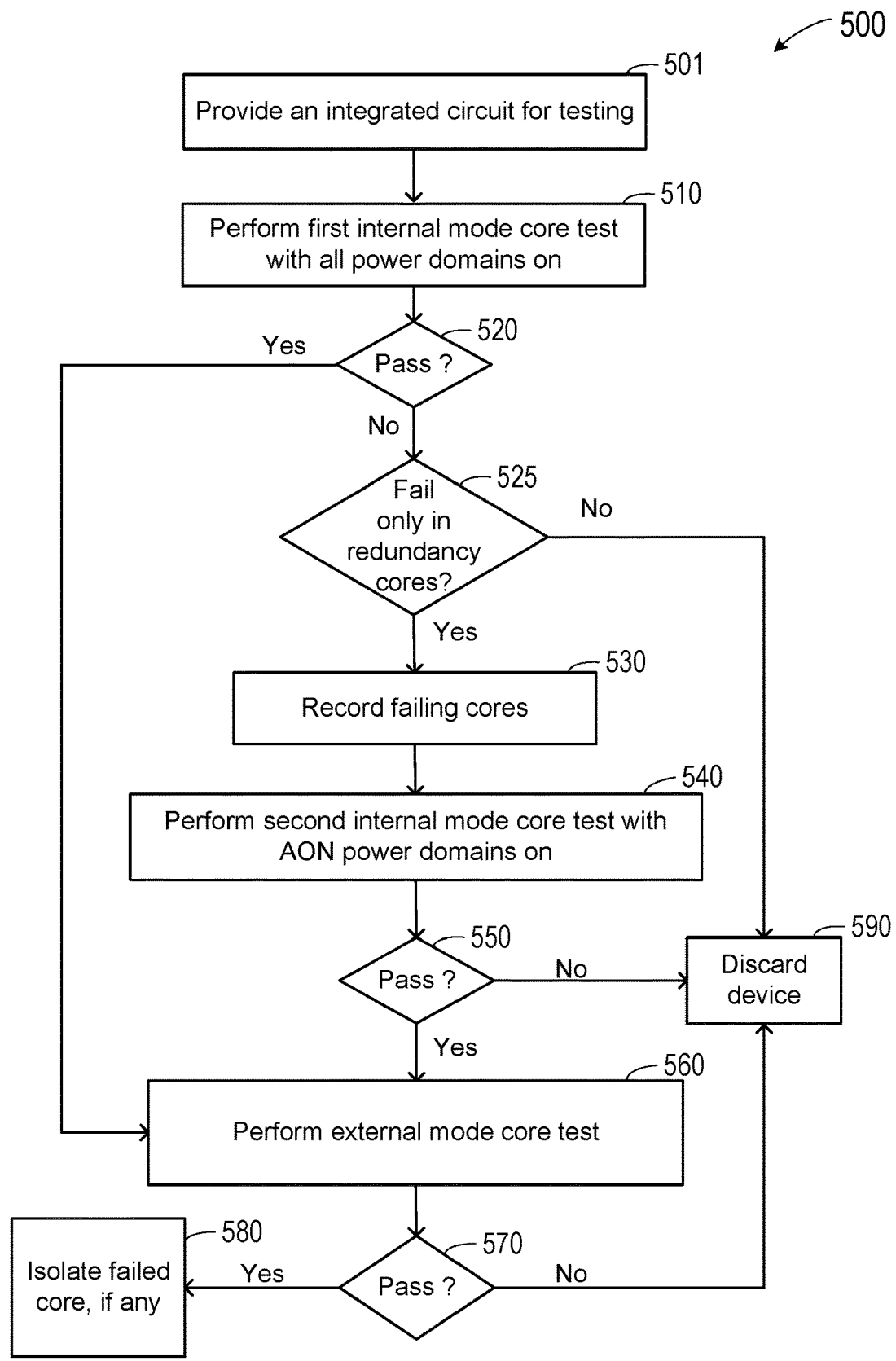
FIG. 5 is a flowchart illustrating a method for testing an integrated circuit that includes multiple cores, according to certain aspects of the disclosure.

FIG. 5 is a flowchart illustrating a method for testing an integrated circuit that includes multiple cores, according to certain aspects of the disclosure. As illustrated in FIG. 5, the method 500 for testing an integrated circuit starts, at step 501, with providing an integrated circuit having multiple cores for testing. In some implementations, each core includes a power-switchable portion in a first power domain and an always-on portion in a second power domain. Examples of such a core are described above in connection to FIGS. 2 and 3. As illustrated in FIG. 2, integrated circuit 200 includes a plurality of cores 210, 220, . . . , and 2n0, etc., and each core is divided into two or more power domains. For example, core 210 includes a power-switchable portion in a first power domain 211, and an always-on portion in a second power domain 212. In a first power domain 211, the operating power can be turned on or off in response to a power control signal. The first power domain 211 includes a first scan chain for performing scan testing in the first power domain. In the always-on power domain 212, the operating power is maintained during operation of the integrated circuit, and the second power domain includes a second scan chain for performing scan testing in the second power domain. Similarly, core 220 includes a power-switchable portion 221 in a first power domain, and an always-on portion in a second power domain 222. Moreover, core 2n0 includes a power-switchable portion 2n1 in a first power domain, and an always-on portion in a second power domain 2n2.

An example of a core in an integrated circuit is illustrated in FIG. 3A. As shown, core 300 includes a power-switchable portion in a first power domain 310, and an always-on portion in a second power domain 320. In the example of FIG. 3A, core 300 also includes power control unit 330, which controls the power switching in the first power domain 310 and power isolation between domains. Besides the core logic circuitry, the first power domain 310 can include a first scan chain 311 for performing scan testing in the first power domain. The first scan chain 311 includes scan cells 314. The first power domain 310 also includes a first test compression engine 312 for coupling between the first scan chain 311 to external test channels of an ATE. In the always-on power domain 320, the operating power is maintained during operation of the integrated circuit. The second power domain 320 includes a second scan chain 321 for performing scan testing in the second power domain and providing wrapper cells for the full core. The second scan chain 321 includes a second test compression engine 322. To facilitate power isolation and test isolation between the first power domain, the second power domain, and the external of the core, the second power domain 320 also includes wrapper cells 324 and isolation gates 333. Two wrapper cells 324 are coupled to the two isolation gates 333, respectively, and the two isolation gates 333 are coupled to two outputs 316, respectively, of the first power domain.

According to certain aspects of the disclosure, the cores in an integrated circuit can be tested to determine if the fault in a faulty core can be isolated to the power-switchable domain. If it can be determined that always-on portions would allow the interfaces to continue to function with the power-switchable domain in the faulty cores isolated and powered off, such faulty cores can be powered off and isolated. In some cases, the integrated circuit can have one or more cores powered off and isolated, and can still be functional. Redundant cores can be activated to replace the faulty cores.

Figure 6:
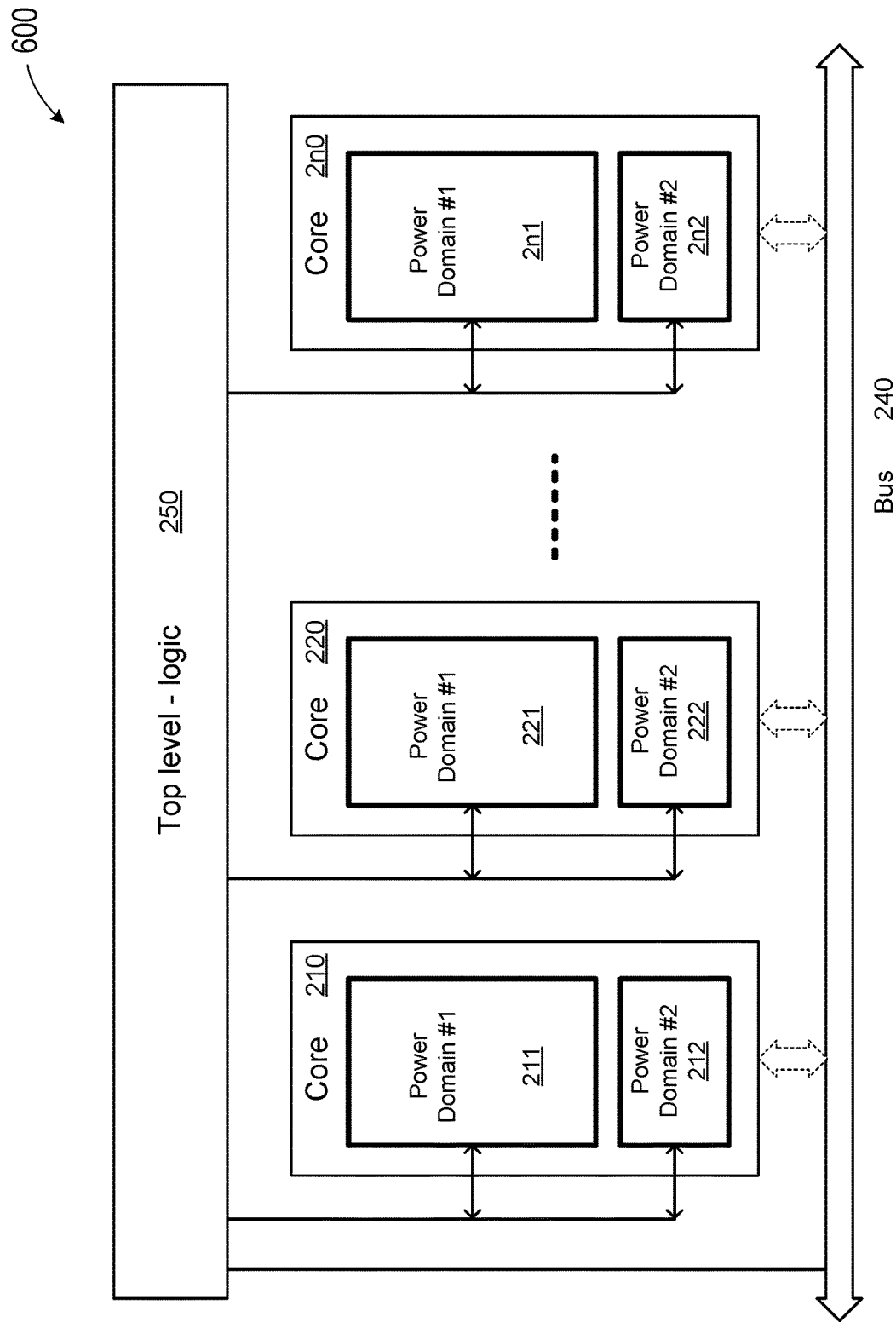
FIG. 6 is a block diagram illustrating an integrated circuit that includes multiple cores configured for internal core testing, according to certain aspects of the disclosure.

At step 510 in method 500, an internal test is performed on the cores, with the power-switchable portion and always-on portion of the core using the first scan chain and the second scan chain. This testing step is described below with reference to FIG. 6. FIG. 6 is a block diagram illustrating an integrated circuit that includes multiple cores configured for internal core testing, according to certain aspects of the disclosure. Integrated circuit 600 in FIG. 6 is similar to integrated circuit 200 in FIG. 2, illustrating an integrated circuit 600 including multiple cores 210, 220, . . . , and 2n0. In this testing step, all of the cores 210, 220, . . . , and 2n0 are subject to an internal mode core test with both power domains powered on, and domain isolation controlled and tested by the test program. Depending on the implementation, each core can be tested in sequence. Alternatively, other testing configuration can be arranged. For example, two or more cores can be tested in parallel.

For this full internal mode core test, both power domains are powered on, and isolation gates are under control of the test program. In each power domain, the test input decompressor in the respective scan compression engine can decompress the compressed test vector to generate an uncompressed test vector, and the uncompressed test vector can be scanned into a scan chain. After capture, the response vector can be scanned out of the scan chain. The respective test result compressor in the scan compression engine in each power domain can generate a compressed response vector by compressing the response vector, and the response outputs can receive the compressed response vector for sending to the test channels to the ATE.

At step 520, the result of the testing in step 510 is examined. If it is determined that all cores have passed this internal core test as described in step 510, the method proceeds to external testing at step 560. If faults are detected, at step 525, the failed cores are examined. The integrated circuits may have different types of cores. For example, the integrated circuit may have multiple instances of certain cores, and can remain operable with one or more instances deactivated. These cores are referred to as cores with redundancies. Other cores may not have redundant instances and cannot be deactivated. At step 525, if it is determined that all cores without redundancy have passed the internal core test as described in step 510, and the failed cores have redundant instances and can be isolated and powered off, the method proceeds to further testing starting at step 530. If, however, the test in step 510 fails in cores other than the types that have redundancies, then the integrated circuit device is discarded, at step 590, because the faulty cores cannot be isolated.

Figure 7:
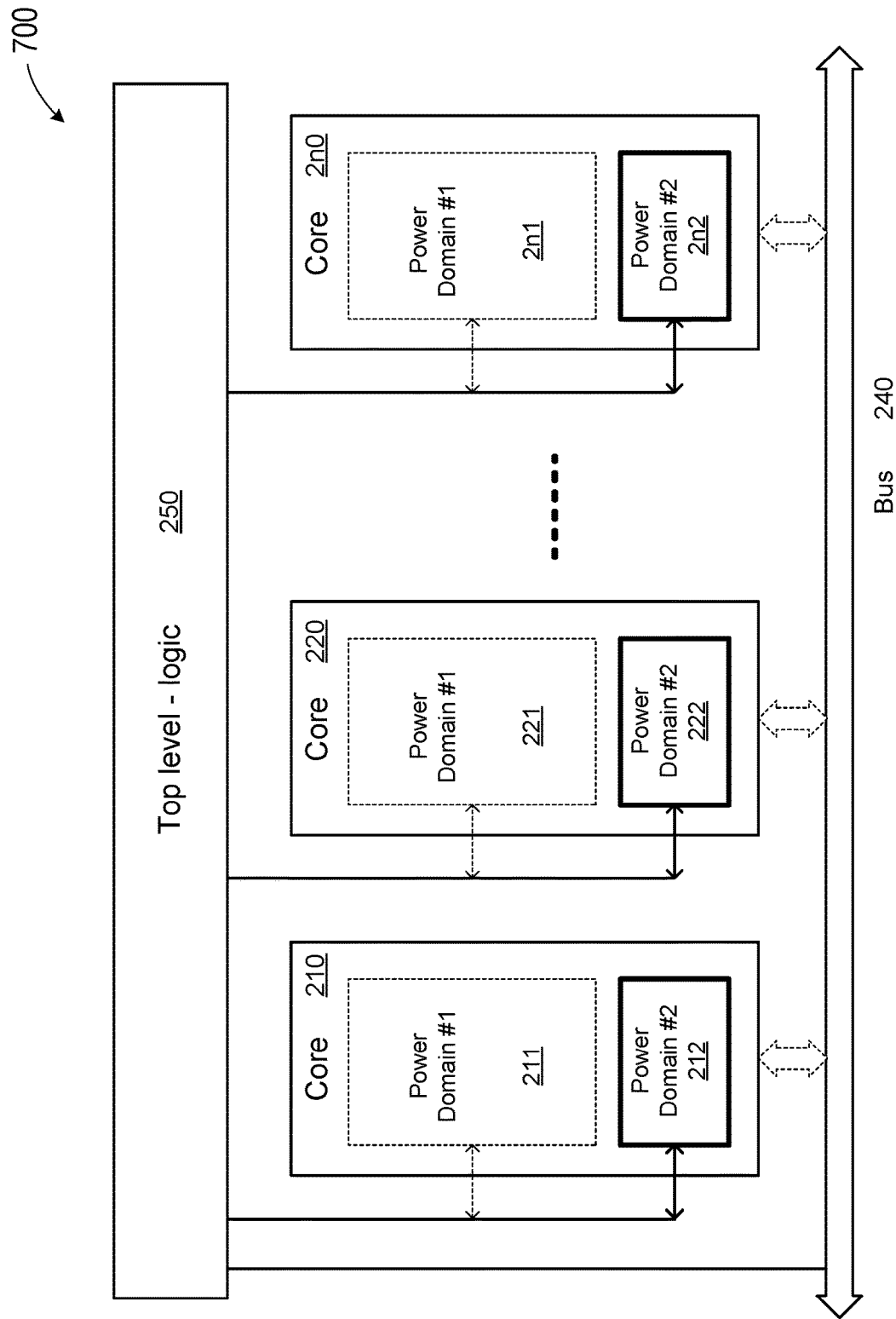
FIG. 7 is a block diagram illustrating an integrated circuit that includes multiple cores configured for internal testing of one power domain, according to certain aspects of the disclosure.

At step 530, any cores that failed the test in step 510 are recorded. At step 540, a second internal mode scan test is performed in only the always-on domains in the cores. For this test, the power-switchable portions are powered off and isolated. FIG. 7 is a block diagram illustrating an integrated circuit that includes multiple cores configured for internal testing of the always-on power domains 212, 222, . . . , and 2n2, according to certain aspects of the disclosure. Integrated circuit 700 in FIG. 7 is similar to integrated circuit 200 in FIG. 2, but modified to show that the power-switchable domains in each core 211, 221, . . . , and 2n1 are powered off and isolated. As illustrated in FIG. 7, the power-switchable domains 211 in core 210, the power-switchable domains 221 in core 220, . . . , and the power-switchable domains 2n1 in core 2n0 are drawn in broken lines to show that they are powered off. Further, for power isolation, the isolation gates (not shown) in each core are clamped to functionally safe values. The isolation gates are shown as 333 in FIG. 3A, but are not shown in FIG. 7 to simplify the drawing. Further, the internal mode core test of the always-on domains 212, 222, . . . , and 2n2 is carried out inside each core using the scan chain in that core. Therefore, the connections to the bus 240 are not used and also shown in broken line.

At step 550, the result of the testing in step 540 is examined. If it is determined that the always-on portions of the cores have passed the internal core test as described in step 540, the method proceeds to further testing at step 560. If, however, the test of the always-on domains in step 540 has failed, then the integrated circuit device is discarded, at step 590, because the faulty core cannot be isolated.

Figure 8:
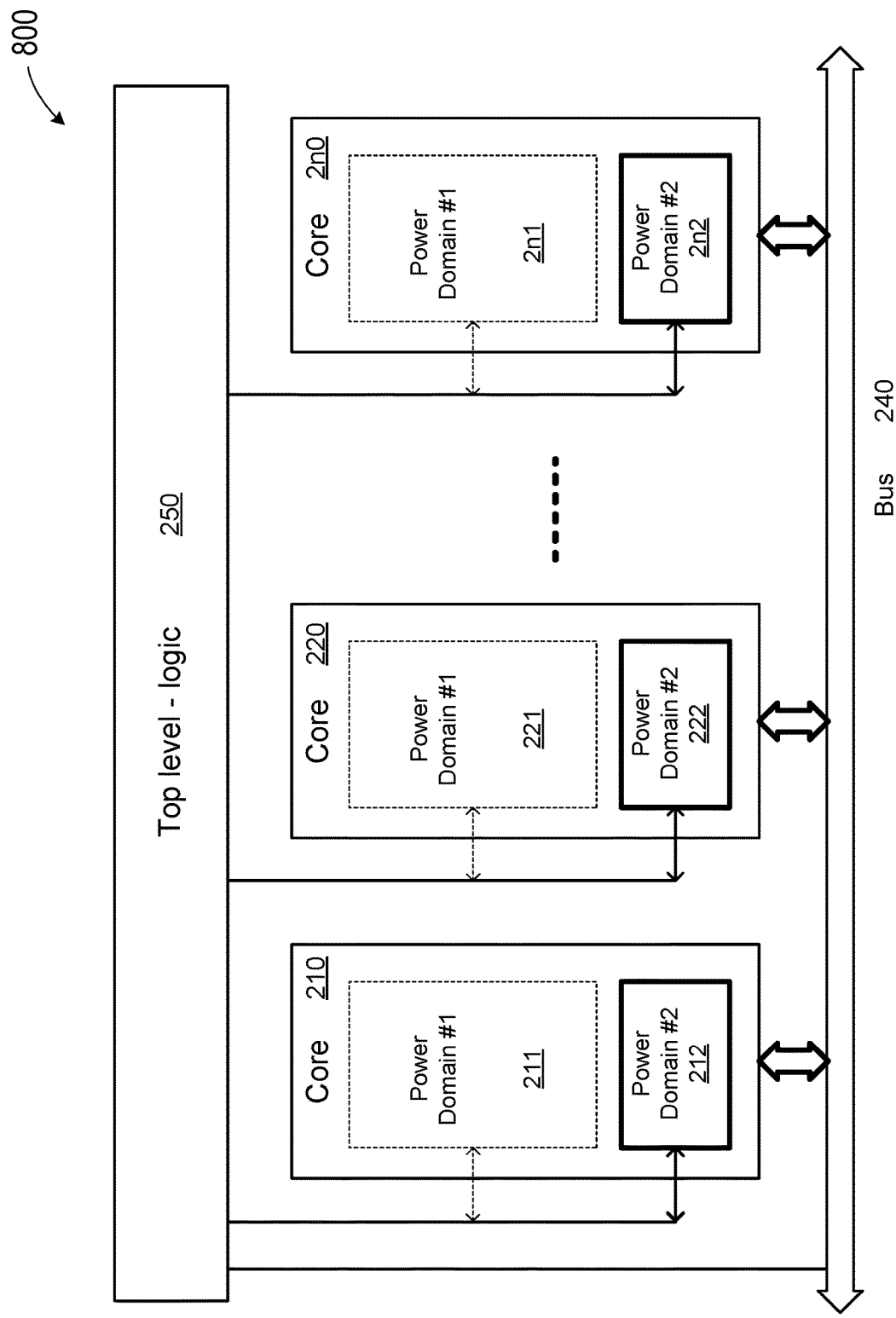
FIG. 8 is a block diagram illustrating an integrated circuit that include multiple cores configured for external testing of the interface between cores, according to certain aspects of the disclosure.

At step 560, an external mode scan test is carried out to test the interfaces between cores. FIG. 8 is a block diagram illustrating an integrated circuit that includes multiple cores configured for external testing of interface between cores, according to certain aspects of the disclosure. Integrated circuit 800 in FIG. 8 is similar to integrated circuit 700 in FIG. 7. As illustrated in FIG. 8, the power-switchable domains 211 in core 210, the power-switchable domains 221 in core 220, and the power-switchable domains 2n1 in core 2n0 are drawn in broken lines to show that they are powered off. Further, the isolation gates in each core are clamped to proper pre-set values. The isolation gates are shown as 333 in FIG. 3A, but are not shown in FIG. 8 to simplify the drawing. Moreover, the connections between the cores to the bus 240 are shown in solid lines to show that the connections between cores 210, 220, . . . , and 2n0 are maintained to allow testing of the interfaces.

At step 570, the result of the testing in step 560 is examined. If it is determined that the external mode test in step 560 has failed, then the integrated circuit device is discarded, at step 590, because the faulty core cannot be isolated. However, if the external test in step 560 has passed, the method proceeds to step 580.

At step 580, the result of the testing in step 560 is that either no failure occurred or the core fails the first internal mode scan test and passes the second internal mode scan test and the external mode scan test. Under this condition, the power-switchable portion of the failed core is to be powered off and isolated during the operation of the integrated circuit.

Figure 9:
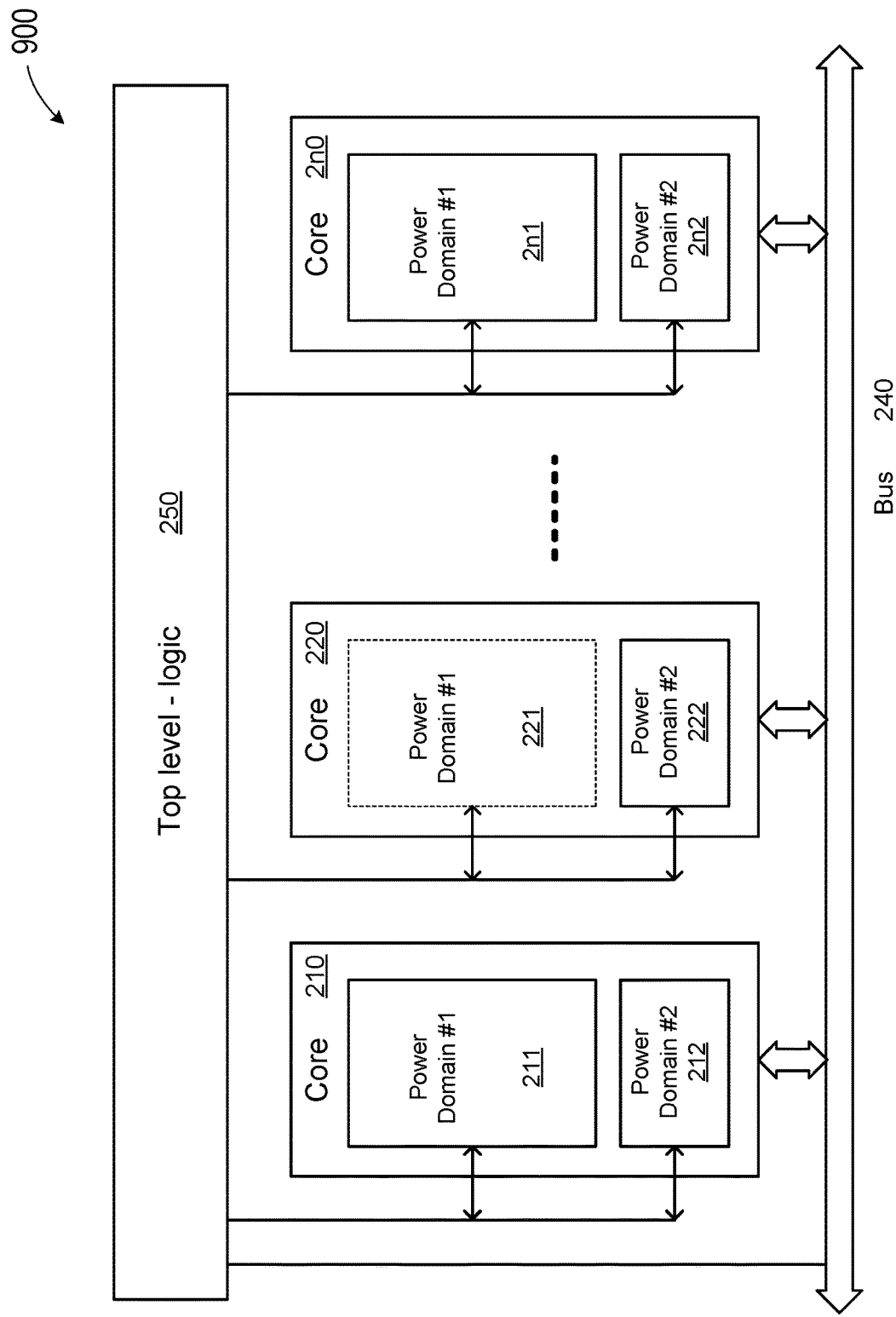
FIG. 9 is a block diagram illustrating an integrated circuit that includes multiple cores with one core powered off and isolated, according to certain aspects of the disclosure.

Once the power-switchable portion of a failing core is identified that can be deactivated and isolated, the information can be recorded in an on-chip non-volatile memory used for core configuration. The information about defective cores stored in the on-chip non-volatile memory can be used when the device is booted during start-up, so that the defective cores can be powered off and isolated during operation. In some examples, the on-chip non-volatile memory can be part of the top-level logic block 250 described above in connection to FIG. 2. In some implementations, this information can be used to power off and isolate the failed cores when the device wakes up from a sleep state, or during a chip boot-up process. In some cases, the integrated circuit can still function with one or more cores deactivated. FIG. 9 is a block diagram illustrating an integrated circuit that includes multiple cores with one core powered off and isolated, according to certain aspects of the disclosure. As shown in FIG. 9, the power-switchable domain 221 of core 220 is powered off and isolated during operation of the integrated circuit.

Figure 10:
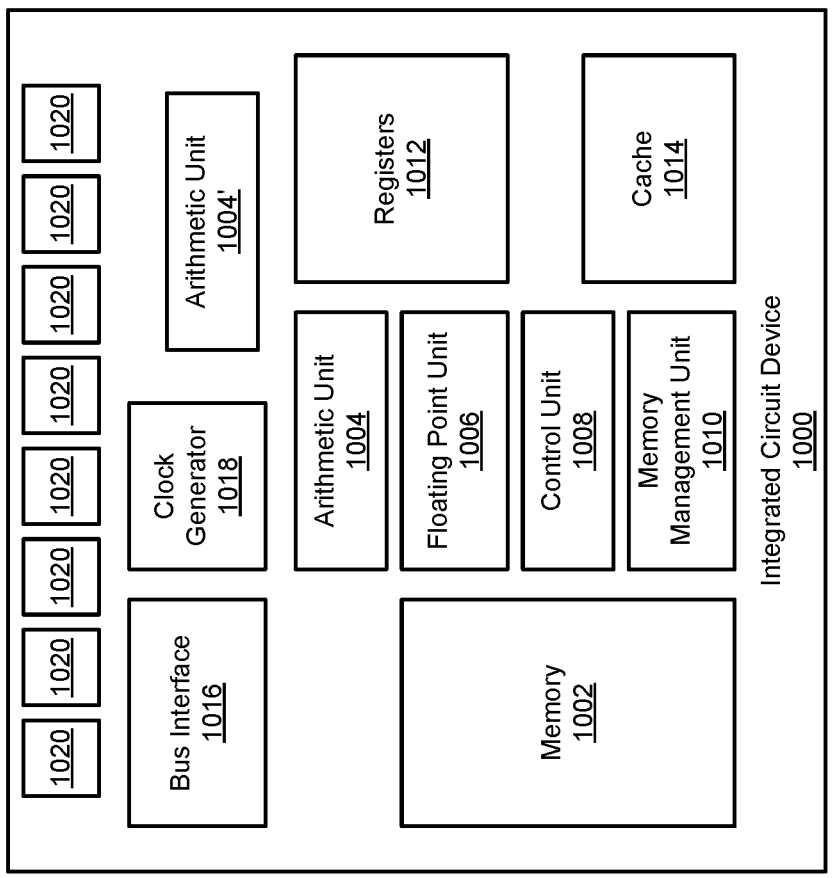
FIG. 10 illustrates an example of an integrated circuit device, according to certain aspects of the disclosure.

FIG. 10 includes a block diagram of an example integrated circuit device 1000, as an example of a device on which the integrated circuit testing techniques discussed above can be applied. In various examples, the integrated circuit device 1000 is a semiconductor-based device that includes multiple layers of substrates forming transistors, capacitors, vias, and other circuit elements. In the example of FIG. 10, the integrated circuit device 1000 is implemented on a single die. In other examples, the integrated circuit device 1000 can be implemented using multiple dies. In still other examples, the integrated circuit device 1000 can be a design core in a larger integrated circuit device, in which the testing techniques described above in connection to FIGS. 2-9 can be applied.

The example integrated circuit device 1000 includes a memory 1002, an arithmetic unit 1004, a floating point unit 1006, a control unit 1008, a memory management unit 1010, registers 1012, a cache 1014, a bus interface 1016, a clock generator 1018, and multiple I/O pads 1020. In some examples, the integrated circuit device 1000 can be a design core in a larger integrated circuit device, in which the testing techniques described above in connection with FIGS. 2-9 can be applied. In another example, multiple instances can be provided for a unit in integrated circuit device 1000. For example, a second instance 1004' of arithmetic unit 1004 in shown in integrated circuit 1000 in FIG. 10. In this case, the testing and isolation method can be applied to the arithmetic unit. If one of the arithmetic units is found to be faulty, it can be isolated.

The memory 1002 can include circuits that are able to store values. For example, the memory 1002 can store instructions that are to be executed by the integrated circuit device 1000. The memory 1002 can be implemented using, for example, a variety of Static Random Access Memory (SRAM). In some examples, the memory 1002 may be small, in view of the limited amount of space in the integrated circuit device 1000.

The arithmetic unit 1004 may be configurable to perform arithmetic or logical operations. The arithmetic unit 1004 can be configured, for example, to read operands from one or more of the registers 1012, and to place results in a register.

The floating point unit 1006 can perform floating point arithmetic. The floating point unit 1006 can also be configured to read operations from the registers 1012 and to write results to the registers 1012.

The control unit 1008 can include circuitry for executing instructions and/or for coordinating the activities of the other blocks in the integrated circuit device 1000. For example, the control unit 1008 can configure the registers from which arithmetic unit 1004 is to read operands, as well as the operation the arithmetic unit 1004 is to perform on the operands. The control unit 1008 can further instruct the arithmetic unit 1004 where to place a result of the operation. As a further example, the control unit 1008 can write data into the registers 1012, and read data from the registers 1012, possibly to move the data to the memory 1002 and/or elsewhere.

The memory management unit 1010 can manage the memory 1002, the cache 1014, and possibly also the registers 1012. The memory management unit 1010 can, for example, cause data to be moved from the memory 1002 to the cache 1014, or vice versa. As a further example, the memory management unit 1010 can cause data to be moved from the cache 1014 to an external memory, or vice versa. In various examples, the operations that the memory management unit 1010 performs are controlled by the control unit 1008. For example, when the control unit 1008 determines that the integrated circuit device 1000 is ready for new instructions to be loaded into the memory 1002, the control unit 1008 can instruct the memory management unit 1010 to obtain the instructions from an external memory.

The registers 1012 can provide temporary storage for values being operated on by the integrated circuit device 1000. Compared to the memory 1002, each register is quite small, storing, for example, one data word each (where a data word can be 16, 32, 64, or another number of bits long). Each register is also directly accessible, such that the number of registers may be limited by the wiring required for each to be independently readable and writeable. Because the registers 1012 are directly accessible and can be read or written faster than the memory 1002, it may be preferable for values being operated on by, for example, the arithmetic unit 1004 or the point unit 1006 to be in the registers 1012, rather than in the memory 1002.

The cache 1014 is a memory where data that was recently used by the integrated circuit device 1000, and/or that may soon need to be used, can be stored. The data can, for example, have been in the memory 1002, was operated on by the control unit 1008, and then was moved to the cache 1014 to make space in the memory 1002 for new data. As another example, the integrated circuit device 1000 may have needed a particular data word, which the memory management unit 1010 may have loaded into the cache 1014 along with a set of data words (e.g., a cache line), under the assumption that the integrated circuit device 1000 may need a data word that was stored in external memory next to the particular data word. The cache 1014 can thus save time by reducing how frequently the integrated circuit device 1000 needs to access external memory. Determining when data needs to be loaded into the cache from an external memory, and/or when data needs to be moved out of the cache, can be handled by the memory management unit 1010.

The bus interface 1016 can include circuitry that enables the integrated circuit device 1000 to communicate with other devices, such as external memories. The bus interface 1016 can implement various protocols, such as Advanced eXtensible Interface (AXI), Advanced High-performance Bus (AHB), Peripheral Component Interconnect (PCI), or another bus protocol. The bus interface 1016 can be connected to the I/O pads 1020 to enable the bus interface 1016 to communicate with external devices. In various examples, the integrated circuit device 1000 can include multiple bus interfaces, which may implement different protocols.

The clock generator 1018 can generate one or more clock signals for the integrated circuit device 1000, which may have different frequencies. In some examples, the clock generator 1018 operates off of a clock input to the integrated circuit device 1000 (received at one of the I/O pads 1020), which the clock generator 1018 can use to generate clock signals of different frequencies.

The I/O pads 1020 can include circuitry for connecting the integrated circuit device 1000 to the physical pins or balls of the package that encloses the integrated circuit device 1000. The pins or balls (e.g., drops of conductive material) can connect the integrated circuit device 1000 to a printed circuit board. Some of the I/O pads 1020 can be for inputting signals into the integrated circuit device 1000, others can be for outputting signals from the integrated circuit device 1000, and/or others can be bi-directional. In most cases, the I/O pads 1020 are present along most of the edges of the integrated circuit device 1000, but only a few are illustrated here, for the sake of clarity.

These blocks illustrated in FIG. 10 provide examples of blocks that can be found in an integrated circuit device, and are intended only to be illustrative. In other examples, an integrated circuit device can include components that are not illustrated here, can include multiple instances of a component, and/or can lack some of the components that are included in this illustration. The arrangement and spacing of the blocks are also not intended to be representative of the arrangement and spacing that may be found in an actual device. The arrangement and spacing have been selected only for the convenience of the illustration.

FIG. 11 includes a block diagram that illustrates an example of a host system 1170 in which the integrated circuit device of FIG. 10 can be used. In some examples, the host system 1170 of FIG. 11 can be used to implement a general purpose computer, such as a desktop computer, a laptop computer, a server computer, a thin client, and so on. In some examples, the host system 1170 can be used to implement mobile computing devices, such as a mobile phone, a smart phone, a personal digital assistant (PDA), or a tablet computer, among other examples. In some examples, the host system 1170 can be used to implement somewhat more special purpose devices, such as home assistants, gaming consoles, electronic books (e-books), media centers, and so on. In some examples, the host system 1170 can be used to implement computing devices incorporated into appliances, automobiles and other vehicles, robots, and other electronic devices.

The example host system 1170 of FIG. 11 includes a host processor 1172, processor memory 1176, Input/Output (I/O) devices 1178, network interfaces 1182, and various support systems 1174. In various implementations, the host system 1170 can include other hardware that is not illustrated here.

The host processor 1172 is a general purpose integrated circuit that is capable of executing program instructions. In some examples, the host processor 1172 can include multiple processing cores. In a multi-core processor, each core may be able to independently execute program code. In some examples, the cores may share resources, such as buses and caches. In some examples, the host processor 1172, whether single core or multi-core, may be a multi-threaded processor, in which case the host processor 1172 can execute multiple threads of execution (e.g., independent sets of program code) at the same time. In some examples, the host system 1170 can include more than one host processor 1172.

The memory 1176 can include memory that is used by the host processor 1172 for storage of program code that the host processor 1172 is in the process of executing, as well as for storage of values that are being operated on by the host processor 1172. For example, the memory 1176 can be storing an operating system 1190, one or more applications 1192, one or more device drivers 1194, and data 1196 associated with the operating system 1190, the applications 1192, and/or the drivers 1194. In various examples, memory 1176 can be implemented using volatile memory types (such as Random Access Memory (RAM) type memories) and/or non-volatile memory types (such as Read-Only Memory (ROM), flash memory, etc.). In some examples, some or all of the memory 1176 may be accessible to the I/O devices 1178. The processor memory 1176 is often referred to as DRAM, though the actual implementation of the memory may not make use of Dynamic Random Access Memory.

The operating system 1190 can coordinate the activities of the hardware of the host system 1170, as well as the activities of the applications 1192 and drivers 1194. For example, the operating system 1190 can perform operations such as scheduling tasks, executing applications, or controlling peripheral devices. In some examples, the operation system 1190 can include a hypervisor which can support the operation of virtual machines on the host system 1170. In some examples, the hypervisor runs as a kernel space application. In these and other examples, each virtual machine can execute an independent operating system, and may have different virtual hardware configurations. Examples of operating systems include Unix, Linux, Windows, Mac OS, iOS, Android, and the like. The operating system 1190 may also be a proprietary operating system.

The applications 1192 can enable a user to interact with the host system 1170 and/or with systems on the network 1180. The applications 1192 can include user space applications, such as web browsers, text editors, video or audio players, and so on. Each of the applications 1192 can be embodied as program code, or instructions that, when executed, cause the host processor 1172 to perform operations that implement the applications 1192. In various examples, the code for the applications 1192 can be stored on a non-volatile storage medium, such as a disk drive, and can be copied into the memory 1176 when being executed.

The drivers 1194 can include programs that manage communications between the operating system 1190 and/or applications 1192 and hardware components of the host system 1170, such as the I/O devices 1178 and network interfaces 1182. For example, a driver can provide an Application Programming Interface (API) that provides abstract commands for using the functions of an I/O device. In this example, the API may be standardized, and the driver may be able to translate the abstract commands to specific commands for a particular I/O device. Drivers are often kernel space applications, so that user-space code may be prevented from accidentally or intentionally misusing the hardware of the host system 1170.

The data 1196 can include data used and/or operated on by the operating system 1190, applications 1192, and/or drivers 1194. Examples of such data include web pages, video data, audio data, images, user data, and so on. Alternatively or additionally, the data 1196 can include software libraries that may be used by the operating system 1190, applications 1192, and/or drivers 1194. In some examples, the data 1196 may be accessible to systems on the network 1180.

The I/O devices 1178 can include hardware that adds functionality to the example host system 1170. For example, the I/O devices 1178 can include non-volatile storage devices, such as solid state drives, magnetic drives, optical drives, and/or tape drives, among other examples. The I/O devices 1178 can further include accelerators such as graphics accelerators, and other, more special purpose, devices. As another example, the I/O devices 1178 can include hardware for connecting to external I/O devices 1186, such as keyboards, monitors, printers, and external storage drives among other devices. The network interfaces 1182 are also I/O devices, though are illustrated separately here for the sake of clarity. Herein, some I/O devices may also be referred to as peripheral devices. In various examples, an I/O device can include a processor and memory that are additional to the host processor 1172 and memory 1176 of the host system 1170. The processor of the I/O device may operate independently of the host processor 1172, or may be used by the host processor 1172 for various purposes. For example, the I/O device can include a Graphics Processing Unit (GPU), which the host processor 1172 can use for large computations. In some examples, the host system 1170 can also be connected to external I/O devices 1186, such as external hard drives.

In some examples, one or more of the I/O devices 1178 can be based on one of the Peripheral Component Interconnect (PCI) standards. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices in a host system. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the host system 1170 can include a storage device that implements NVMe as the primary communication interface.

A PCI-based device can include one or more functions. A "function" describes operations that may be provided by the device. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, a PCI-based device can include single-root I/O virtualization (SR-IOV). SR-My is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to the operating system 1190 and/or applications 1192 to be multiple devices providing the same functionality. The functions of an SR-IOV-capable device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as, for example, a virtual machine) running on a host system 1170.

The network interfaces 1182 can enable the host system 1170 to communicate with a network 1180 or with multiple networks. The network interfaces 1182 can include, for example, one or more network interface cards (NICs). The network interfaces 1182 can include, for example, physical ports for connecting to a wired network. Alternatively or additionally, the network interfaces 1182 can include antennas for connecting to a wireless network. In some examples, the network interfaces 1182 can include more than one physical port, and/or more than one antenna, so that the host system 1170 can communicate with multiple networks at the same time.

The support systems 1174 can include various hardware that supports the operations of the host processor 1172 and/or the I/O devices 1178. For example, the support systems 1174 can include a boot ROM that stores the code for the Basic Input/Output System (BIOS) of the host system 1170, and that enables the host system 1170 to boot from being powered on. As another example, the various support systems 1174 can include a power supply and power subsystem. Other devices that may be found in the support systems 1174 can include a Board Management Controller (BMC) and/or various other volatile or non-volatile memories.

The host system 1170 can further include one or more busses 1184, which may also be referred to as interconnects. The busses 1184 can enable the various components of the example host system 1170 to communicate with one another. For example, the busses 1184 can include a bus that is dedicated to communications between the host processor 1172 and the processor memory 1176. As another example, the busses 1184 can include an I/O bus, which enables the host processor 1172 to communicate with the I/O devices 1178, and which may enable the I/O devices 1178 to communicate among each other. In some examples, the I/O bus is a PCI-based bus or bus network. The busses 1184 can include other busses, such as a power management bus, sideband busses, control busses, and/or dedicated busses between certain components (e.g., a BMC and the host processor 1172).

The memory 1176, storage devices, and other memories discussed above are each examples of computer-readable media. Other examples of computer-readable medium include removable storage devices, such as magnetic tapes, floppy disks, Compact Discs (CDs), Digital Versatile Discs (DVDs), Blue-Ray disks, and flash memory drives, among other examples. In each of these examples the compute-readable medium is capable of storing program code that can be executed by the host processor 1172. In some cases, the computer-readable medium may be non-transitory, meaning that the data stored on the computer-readable medium remains stored on the medium when power is not applied to the computer readable medium. In contrast, when power is removed from a transitory computer-readable medium, such as RAM, the data is deleted from the medium. Examples of a non-transitory computer-readable medium include ROM-based memory, hard disks, removable disks such as those listed above, and flash-based memory, among other examples.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 10 and FIG. 11, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An integrated circuit, comprising:
a plurality of cores, wherein each core comprises:
a power-switchable portion in a first power domain which can be turned on or off, the first power domain including a first scan chain for performing scan testing in the first power domain;
an always-on portion in a second power domain which stays powered on during operation of the integrated circuit, the second power domain including a second scan chain for performing scan testing in the second power domain; and
an isolation gate coupled to each output of the first power domain, wherein the second scan chain includes a wrapper cell coupled to each isolation gate that drives an external interface of the core;
wherein the integrated circuit is configured to power off and isolate the power-switchable portion of a core, if the core fails a first internal mode scan test but passes a second internal mode scan test and an external mode scan test;
wherein:
the first internal mode scan test is performed on the power-switchable portion and the always-on portion of the core using the first scan chain and the second scan chain with both the first power domain and the second power domain powered on;
the second internal mode scan test is performed on the always-on portion using the second scan chain with the power-switchable portion powered off and isolated; and
the external mode scan test is performed on interfaces between cores.

2. The integrated circuit of claim 1, wherein the second scan chain comprises one or more wrapper cells that are functional registers in the integrated circuit, and the second scan chain further comprises one or more dedicated wrapper cells that are not functional registers in the integrated circuit, and wherein the one or more dedicated wrapper cells are coupled to isolation gates that are coupled to external interface signals that extend from the power-switchable portion to outside the core.

3. The integrated circuit of claim 1, wherein:
the power-switchable portion comprises a first compression engine coupled to the first scan chain; and
the always-on portion comprises a second compression engine coupled to the second scan chain.

4. The integrated circuit of claim 1, wherein the isolation gate is configured to clamp the respective output of the first power domain to a pre-set value.

5. An integrated circuit comprising first and second cores, wherein each core comprises:
a power-switchable portion in a first power domain in which an operating power is turned on or off in response to a power control signal, the first power domain including a first scan chain for performing scan testing in the first power domain, the first power domain including a plurality of outputs; and
an always-on portion in a second power domain in which the operating power is maintained during testing of the integrated circuit, the second power domain including a second scan chain for performing scan testing in the second power domain;
wherein the second power domain further includes respective isolation gates coupled to the plurality of outputs of the first power domain; and
wherein the integrated circuit is configured to power-down and isolate the power-switchable portion in the first power domain based on a scan test result.

6. The integrated circuit of claim 5, wherein, in the second power domain, the second scan chain comprises a wrapper cell coupled to some of the isolation gates.

7. The integrated circuit of claim 5, wherein the second scan chain comprises one or more wrapper cells that are functional registers in the integrated circuit, and the second scan chain further comprises one or more dedicated wrapper cells that are not functional registers in the integrated circuit, the one or more dedicated wrapper cells coupled to external interface signals that extend from the power-switchable portion to outside the core.

8. The integrated circuit of claim 5, wherein each of the first and second cores comprises a power control unit configured to:
maintain power in both the first power domain and the second power domain to allow a first internal mode scan test of the power-switchable portion and the always-on portion of the core using the first scan chain and the second scan chain;
maintain power in the second power domain and power off and isolate the first power domain to allow a second internal mode scan test in the always-on portion using the second scan chain; and
maintain power in the second power domain and power off and isolate the first power domain to allow an external mode scan test of interfaces between cores.

9. The integrated circuit of claim 8, further comprising an on-chip non-volatile memory for storing information to indicate that a power-switchable portion in a core should be powered off, if the core fails the first internal mode scan test and passes the second internal mode scan test and the external mode scan test.

10. The integrated circuit of claim 5, wherein each core comprises an additional power-switchable portion in an additional power domain.

11. The integrated circuit of claim 5, wherein:
the power-switchable portion comprises a first compression engine coupled to the first scan chain; and
the always-on portion comprises a second compression engine coupled to the second scan chain.

12. The integrated circuit of claim 5, further comprising a top-level logic including a top-level scan chain.

13. The integrated circuit of claim 5, wherein the integrated circuit comprises a power management unit configured to provide power control signals to the first and second cores.

14. A method for testing an integrated circuit, comprising:
selecting, using a processor in a tester, a core in the integrated circuit for testing, the integrated circuit comprising first and second cores, wherein each of the first and second cores includes a power-switchable portion in a first power domain and an always-on portion in a second power domain, the first power domain having a first scan chain and the second power domain having a second scan chain;
performing, using a scan test circuitry in the integrated circuit, a first internal mode scan test of the power-switchable portion and the always-on portion of the selected core using the first scan chain and the second scan chain with both the first power domain and the second power domain powered on;
performing, using the scan test circuitry in the integrated circuit, a second internal mode scan test in the always-on portion using the second scan chain with the power-switchable portion powered off and isolated; and determining, using the processor in the tester, based on the first internal mode scan test or the second internal mode scan test, information about whether the power-switchable portion of the selected core should be powered off and isolated during operation of the integrated circuit.

15. The method of claim 14, further comprising, during the first internal mode scan test, using dedicated wrapper cells to contain external interface signals that extend from the power-switchable portion to outside the core, the dedicated wrapper cells not being functional registers in the core.

16. The method of claim 14, wherein determining information about whether the power-switchable portion of the selected core should be powered off and isolated during operation of the integrated circuit comprises:

determining if the selected core fails the second internal mode scan test and, if so, determining that the integrated circuit is to be discarded;

performing an external mode scan test of interfaces between the first and second cores, with power-switchable portions in all cores powered off;

determining if the selected core fails the external mode scan test and, if so, determining that the integrated circuit is to be discarded; and determining if the core fails the first internal mode scan test and passes the second internal mode scan test and the external mode scan test and, if so, determining that the power-switchable portion of the core is to be deactivated and isolated.

17. The method of claim 16, wherein performing the external mode scan test comprises using a top-level logic and a wrapper scan chain of the always-on portion in the second power domain of each core to test interfaces between cores.

18. The method of claim 14, further comprising, after it is determined that the power-switchable portion of the selected core is to be deactivated and isolated, storing information about the powered off and isolated core in an on-chip non-volatile memory used for core configuration.

19. The method of claim 14, wherein:

the power switchable portion is configured to turn on and off in response to a power control signal; and the always-on portion is configured to maintain operating power during testing of the integrated circuit.

20. The method of claim 14, wherein:

the power switchable portion comprises a first compression engine coupled to the first scan chain; and the always-on portion comprises a second compression engine coupled to the second scan chain.

* * * * *